US012791646B2

(12) United States Patent
Haji-Valizadeh

(10) Patent No.: US 12,791,646 B2
(45) Date of Patent: Nov. 10, 2026

(54) FOCUSED MOTION CORRECTION IN MAGNETIC RESONANCE IMAGING

(71) Applicant: CANON KABUSHIKI KAISHA, Tokyo (JP)

(72) Inventor: Hassan Haji-Valizadeh, Beachwood, OH (US)

(73) Assignee: CANON KABUSHIKI KAISHA, Tokyo (JP)

( * ) Notice: Subject to any disclaimer, the term of this patent is extended or adjusted under 35 U.S.C. 154(b) by 182 days.

(21) Appl. No.: 18/769,765

(22) Filed: Jul. 11, 2024

(65) Prior Publication Data

US 2026/0016553 A1 Jan. 15, 2026

(51) Int. Cl.

| | |
|---|---|
| ***G01R 33/56*** | (2006.01) |
| ***G01R 33/48*** | (2006.01) |
| ***G06T 12/10*** | (2026.01) |

(52) U.S. Cl.

CPC ..... *G01R 33/5608* (2013.01); *G01R 33/4818* (2013.01); *G06T 12/10* (2026.01); *G06T 2210/41* (2013.01)

(58) Field of Classification Search

CPC ............ G01R 33/5608; G01R 33/4818; G01R 33/5676; G01R 33/5611; G01R 33/56509; G06T 12/10; G06T 2210/41; G06N 3/0464

See application file for complete search history.

(56) References Cited

U.S. PATENT DOCUMENTS

| | | | | |
|---|---|---|---|---|
| 2008/0310696 | A1 | 12/2008 | Hwang | |
| 2022/0187406 | A1 * | 6/2022 | Wang | G06T 5/77 |

OTHER PUBLICATIONS

Pipe, "Motion Correction with Propeller MRI: Application to Head Motion and Free-Breathing Cardiac Imaging", Magnetic Resonance in Medicine: An Official Journal of the International Society for Magnetic Resonance in Medicine, Wiley-Liss, Inc., 1999, vol. 42.5, pp. 963-969.

Vecchiato et al., "Evaluation Of Disorder: Retrospective Image Motion Correction for Volumetric Brain MRI in a Pediatric Setting", American Journal of Neuroradiology, www.ajnr.org, Apr. 2021, vol. 42.4, pp. 774-781.

Lin et al., "Motion Correction Using an Enhanced Floating Navigator and GRAPPA Operations", Magnetic Resonance in Medicine: An Official Journal of The International Society for Magnetic Resonance in Medicine, Wiley-Liss, Inc., Nov. 13, 2009, vol. 63, No. 2, pp. 339-348.

(Continued)

*Primary Examiner* — G.M. A Hyder

(74) *Attorney, Agent, or Firm* — Maier & Maier, PLLC

(57) ABSTRACT

A method, system, processing circuitry, and computer program product for providing initial motion correction in magnetic resonant imaging (MRI) data that enables additional image correction to be performed on subsequently processed MRI data in the same imaging set. One such method receives k-space data including a first set of motion corrupted k-space data and a second set of k-space data (different than the first set); generates motion correction data based on the first set of motion corrupted k-space data; and generates an image based on the second set of undersampled k-space data and the motion correction data.

16 Claims, 18 Drawing Sheets

(56) References Cited

OTHER PUBLICATIONS

Griswold et al., "Generalized Autocalibrating Partially Parallel Acquisitions (GRAPPA)", Magnetic Resonance in Medicine: An Official Journal of the International Society for Magnetic Resonance in Medicine, Wiley-Liss, Inc., 2002, vol. 47.6, pp. 1202-1210.
Uecker et al., "ESPIRIT—An Eigenvalue Approach to Autocalibrating Parallel MRI: Where SENSE Meets GRAPPA", Magnetic Resonance in Medicine, Wiley Periodicals, Inc., May 6, 2013, vol. 71.3, pp. 990-1001.
Slipsager et al., "Comparison of Prospective and Retrospective Motion Correction in 3D-Encoded Neuroanatomical MRI", Magnetic Resonance in Medicine, PMC, Feb. 2022, vol. 87, No. 2, pp. 629-645.
Loktyushin et al., "Retrospective Rigid Motion Correction of Undersampled MRI Data", In Intl. Soc. Mag. Reson. Med, 2015, 1 page.
Zhao et al., "Iterative GRAPPA (iGRAPPA) for Improved Parallel Imaging Reconstruction", Magnetic Resonance in Medicine: An Official Journal of The International Society for Magnetic Resonance in Medicine, Wiley-Liss, Inc., 2008, vol. 59, No. 4, pp. 903-907.
Dawood et al., "Iterative Training of Robust K-Space Interpolation Networks for Improved Image Reconstruction with Limited Scan Specific Training Samples", Magnetic Resonance in Medicine, The Authors, Wiley Periodicals LLC on behalf of International Society for Magnetic Resonance in Medicine., Oct. 13, 2022, vol. 89, No. 2, pp. 812-827.
Wallace et al., "Head Motion Measurement and Correction Using FID Navigators", Magnetic Resonance in Medicine, PMC, Jan. 2019, vol. 81, No. 1, pp. 258-274.
Santelli et al., "Respiratory Bellows Revisited for Motion Compensation: Preliminary Experience for Cardiovascular MR", Magnetic Resonance in Medicine, Wiley-Liss, Inc., Nov. 3, 2010, vol. 65.4, pp. 1098-1103.
Tremblay et al., "Retrospective Coregistration of Functional Magnetic Resonance Imaging Data Using External Monitoring", Magnetic Resonance in Medicine: An Official Journal of the International Society for Magnetic Resonance in Medicine, Wiley-Liss, Inc., 2005, vol. 53.1, pp. 141-149.
Frost et al., "Markerless High-Frequency Prospective Motion Correction for Neuroanatomical MRI", Magnetic Resonance in Medicine, International Society for Magnetic Resonance in Medicine, 2019, vol. 82.1, pp. 126-144.
Ludwig et al., "Pilot Tone-Based Motion Correction for Prospective Respiratory Compensated Cardiac Cine MRI", Magnetic Resonance in Medicine, Physikalisch-Technische Bundesanstalt, Wiley Periodicals LLC on behalf of International Society for Magnetic Resonance in Medicine, 2021, vol. 85.5, pp. 2403-2416.
Huang et al., "Data Convolution and Combination Operation (COCOA) for Motion Ghost Artifacts Reduction", Magnetic Resonance in Medicine, Wiley-Liss, Inc., 2010, vol. 64, 10 pages.
Haskell et al., "Targeted Motion Estimation and Reduction (TAMER): Data Consistency Based Motion Mitigation for MRI using a Reduced Model Joint Optimization", IEEE Trans Med Imaging, May 2018, vol. 37, No. 5, 30 pages.
Slipsager et al., "Comparison of Prospective and Retrospective Motion Correction in 3D-Encoded Neuroanatomical MRI", Magn. Reson. Med., Feb. 2022, vol. 87, No. 2, 28 pages.
Extended European Search Report issued on Mar. 12, 2026, in corresponding European Patent Application No. 25185970.8, 20 pages.

* cited by examiner

FOCUSED MOTION CORRECTION IN MAGNETIC RESONANCE IMAGING

BACKGROUND OF THE INVENTION

Field of the Invention

A method, system, processing circuitry, and computer program product for providing image correction in medical images, and in one embodiment, to a method, system and computer program product for providing initial motion correction in magnetic resonant imaging (MRI) data that enables additional image correction to be performed on subsequently processed MRI data in the same imaging set.

Discussion of the Background

Motion artifacts are a common problem in medical imaging, such as magnetic resonance imaging (MRI) due, at least in part, to long acquisition times. Images with motion can be detected and rejected as described in U.S. Pat. No. 9,710,937 entitled "Local artifact reduction with insignificant side effects."

Navigators correct for in-plane rigid body motion and can also be used for shot rejection. See, for example, (1) Lin, W., Huang, F., Börnert, P., Li, Y. and Reykowski, A., 2010; Motion correction using an enhanced floating navigator and GRAPPA operations; Magnetic Resonance in Medicine: An Official Journal of the International Society for Magnetic Resonance in Medicine, 63(2), pp. 339-348; (2) Kober, T., Marques, J. P., Gruetter, R. and Krueger, G., 2011. Head motion detection using FID navigators. Magnetic resonance in medicine, 66(1), pp. 135-143; and (3) Wallace, T. E., Afacan, O., Waszak, M., Kober, T. and Warfield, S. K., 2019. Head motion measurement and correction using FID navigators. Magnetic resonance in medicine, 81(1), pp. 258-274. The contents of each of those three references are incorporated herein by reference.

Iterative post-processing methods can determine unknown patient motion and correct motion artifact through entropy-related focus criterion. See, for example, Atkinson, D., Hill, D. L., Stoyle, P. N., Summers, P. E., Clare, S., Bowtell, R. and Keevil, S. F., 1999. Automatic compensation of motion artifacts in MRI. Magnetic Resonance in Medicine: An Official Journal of the International Society for Magnetic Resonance in Medicine, 41(1), pp. 163-170, the contents of which are incorporated herein by reference.

Aligned SENSE jointly estimates rigid motion parameters and reconstructs MR images using an iterative reconstruction framework. This iterative framework relies on redundant information provided by multiple coils, as is described in Cordero-Grande, L., Teixeira, R. P. A., Hughes, E. J., Hutter, J., Price, A. N. and Hajnal, J. V., 2016. Sensitivity encoding for aligned multishot magnetic resonance reconstruction. IEEE Transactions on Computational Imaging, 2(3), pp. 266-280, the contents of which are incorporated herein by reference.

Prospective methodologies using cameras enable real-time motion tracking and dynamic updating of acquisition geometry as is described in Siemens has partnered with KinetiCor on a four camera in-bore system, https://www.siemens-healthineers.com/press-room/press-releases/pr-20180617020shs.html.

In one known method of performing motion compensation through shot rejection, portions (called "shots") of a motion-corrupted k-space are removed from the k-space data and image reconstruction is performed using a resulting undersampled k-space. However, such a shot rejection-based technique can lead to lower quality images as discussed below.

As shown in FIG. 1A, the k-space data is a set of imaging data at various frequencies in the frequency domain that can be converted to an image in the spatial domain. The frequency domain information can be conceptualized graphically as a set of lower frequencies in the central portion of the k-space (e.g., $f_{1,1}$, $f_{-1,1}$, $f_{1,-1}$, $f_{-1,-1}$) with increasingly higher frequencies moving away from the center, and having the highest frequencies at the corners (e.g., at $f_{n,n}$, $f_{n,-n}$, $f_{-n,n}$, and $f_{-n,-n}$). Not all frequencies (also referred to as lines) need be acquired (sampled) to produce some types of images from k-space data, and those data sets that are not fully sampled are referred to as undersampled data sets. the central, lower frequency portions of the k-space data may be fully-sampled during scanning so that those frequencies may be used as an auto-calibration signal (ACS) (shown within the thickened square at the center of the k-space data of FIGS. 1A and 1B).

In addition, to data being absent from a k-space data set due to intentional undersampling, it also is possible a patient may have moved during imaging, and an indication that motion occurred may be saved as part of the imaging or be referenced in conjunction with the access to the imaging data. Thus, for each point or line of k-space, representative data may include whether the data is present (P), whether the data is missing (X) due to undersampling, and when data is present, what the magnitude and phase is for each sampled point in the set of points that make up the k-space line, and whether motion (M) was present. To help describe the inventions herein, the magnitudes and phases for each sampled k-space point will be referred to using the letter(S), and the above notations (P, X, S and M) may be added to boxes representing the acquired k-space imaging data. For example, data for the low frequencies all are present in FIG. 1B and include sampled magnitude and phase values (S4, S5, S12, and S13), but the k-space data for frequencies $f_{x,1}$ were acquired in the presence of motion. To avoid clutter, blank boxes are considered to have k-space data and be free of motion, and the sampled magnitudes and phases(S) of points may be omitted from illustrations of present, motion-free data as well. In general, a full readout will have similar behavior (e.g., motion corrupted or undersampled). Readouts can take different forms. One such form is a line in Cartesian space. In this scenario, all k-space points along that line will have the same behavior.

As shown in FIG. 2, in a known system, motion-corrupted k-space data is received by a system for generating a spatial image (e.g., a medical image). In the illustrated example, there are two lines that were known to be acquired in the presence of motion (M), and a system may elect to remove those lines when generating the spatial image. As shown in FIG. 2, lines corresponding sampled values S5 to S9 both were obtained in the presence of motion (either as noted in the data itself or as detected via a navigator signal and/or other motion detection circuitry). The result of performing motion shot rejection on the motion-corrupted k-space data is that two lines are now indicated (with Xs) as missing within the k-space and will be filled in with approximated data during an undersampled reconstruction. Additional missing lines that were missing due to undersampling or errors also may be present in the undersampled k-space.

Known undersampled reconstruction methods, such compressed sensing (CS) reconstruction and deep learning reconstruction (DLR), utilize a complete central ACS during reconstruction. For example, as shown in FIG. 2, the ACS data can be used by a sensitivity map generator to generate a sensitivity map. However, in the illustrated embodiment, the ACS itself that is being used to help determine how to fill in the missing lines has motion in it that will reduce the ability of the sensitivity map to aid in the undersampled reconstruction. The resulting spatial image, therefore, although corrected for motion generally, nonetheless, may be a low-quality spatial image.

External ACS can be obtained separately from imaging data, reducing ACS sensitivity to motion. External ACS is limited by: (a) the possibility for inconsistency between ACS and imaging data due to motion, (b) the possibility for ACS corruption due to motion, (c) the possibility for reduced reconstruction performance when External ACS and imaging data are acquired with different sequence parameters, and/or (d) increased scan time needed for external ACS.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION

The terms "a" or "an", as used herein, are defined as one or more than one. The term "plurality", as used herein, is defined as two or more than two. The term "another", as used herein, is defined as at least a second or more. The terms "including" and/or "having", as used herein, are defined as comprising (i.e., open language). Reference throughout this document to "one embodiment", "certain embodiments", "an embodiment", "an implementation", "an example" or similar terms means that a particular feature, structure, or characteristic described in connection with the embodiment is included in at least one embodiment of the present disclosure. Thus, the appearances of such phrases or in various places throughout this specification are not necessarily all referring to the same embodiment. Furthermore, the particular features, structures, or characteristics may be combined in any suitable manner in one or more embodiments without limitation.

The present disclosure is related to a method, system, and non-transitory computer-readable storage medium storing computer-readable instructions for providing initial motion correction in imaging data (e.g., magnetic resonant imaging (MRI) data) that enables additional image correction to be performed on subsequently processed imaging data within the same data set.

In one embodiment, it can be appreciated that the present disclosure can be viewed as a system. While the present exemplary embodiments will refer to an MRI apparatus, it can be appreciated that other system configurations can use other medical imaging apparatuses (e.g., CT systems and combined MRI/CT systems).

Figure 1A:
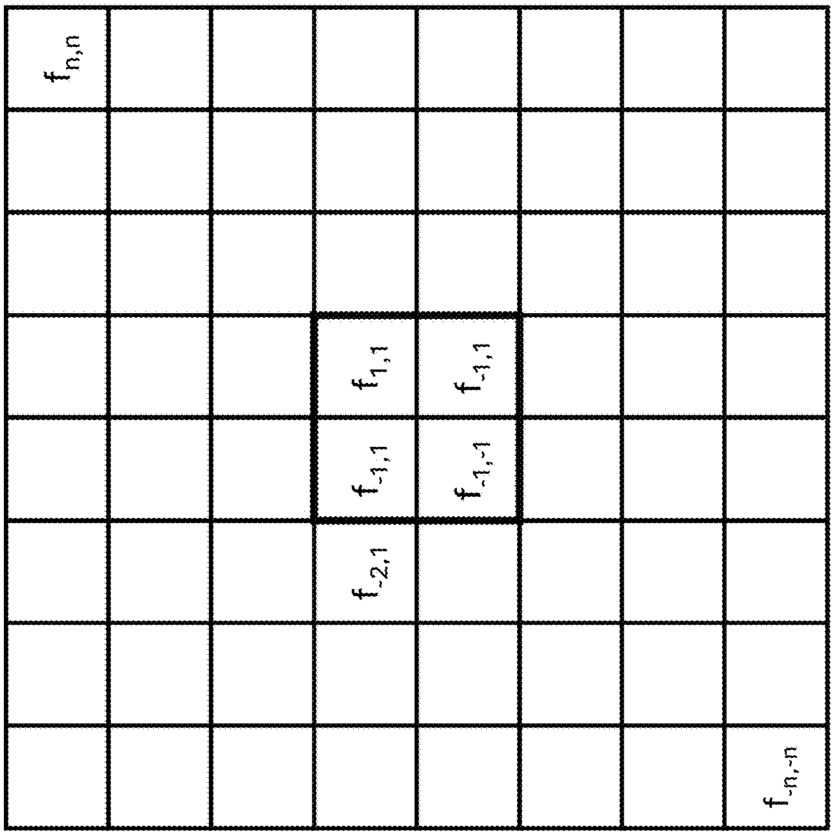
FIG. 1A is a schematic illustration of exemplary frequencies/lines of k-space imaging data including fully sampled, central k-space data acting as an auto-calibration signal (ACS)
Figure 1B:
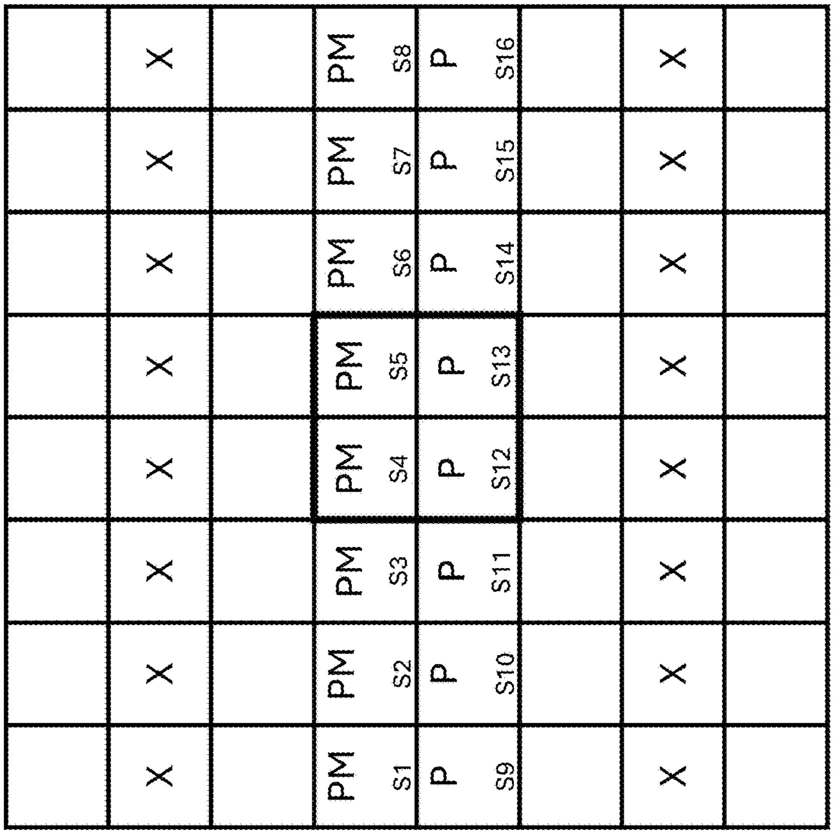
FIG. 1B is a schematic illustration of exemplary k-space imaging data showing whether or not various lines are present, whether there was motion when the corresponding line was sampled, and what the energy data is for the respective line.
Figure 2:
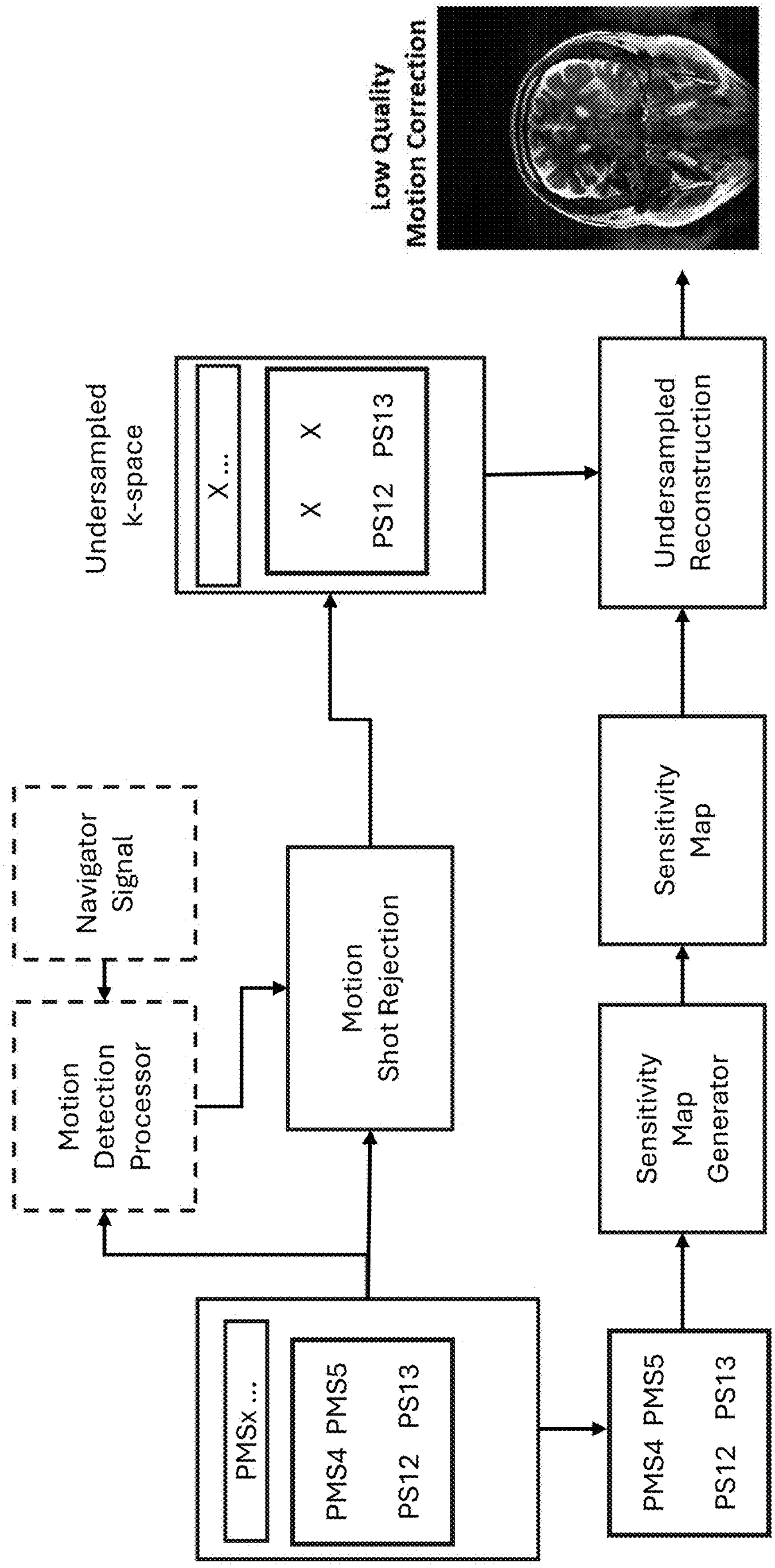
FIG. 2 is a block diagram showing a known image generation architecture that utilizes undersampled reconstruction based on a corrupted/uncorrected ACS resulting in lower image quality.
Figure 3:
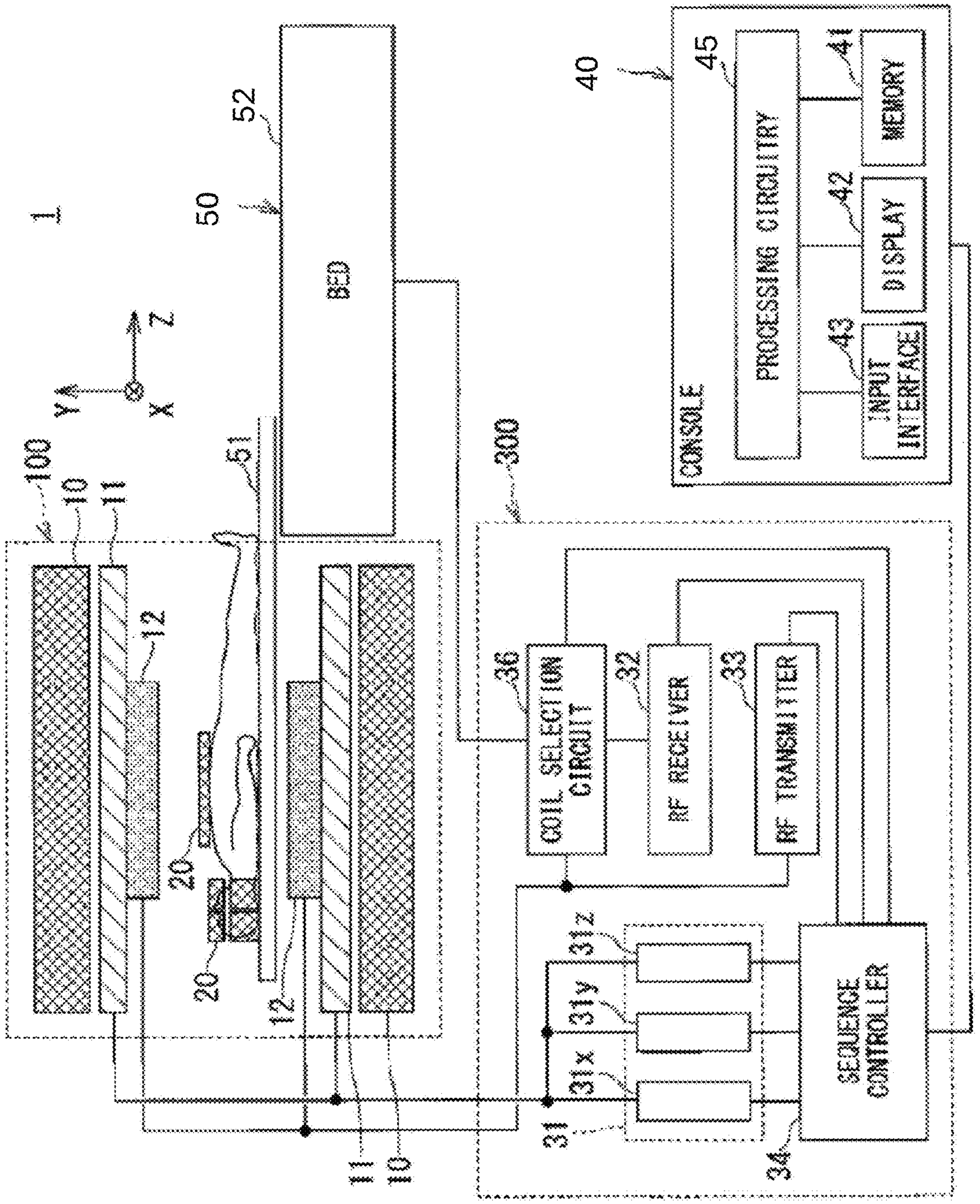
FIG. 3 is a schematic of an MRI apparatus.

Referring now to the drawings, FIG. 3 is a block diagram illustrating overall configuration of an MRI apparatus 1. The MRI apparatus 1 includes a gantry 100, a control cabinet 300, a console 40, a bed 50, and radio frequency (RF) coils 20. The gantry 100, the control cabinet 300, and the bed 50 constitute a scanner, i.e., an imaging unit.

The gantry 100 includes a static magnetic field magnet 10, a gradient coil 11, and a whole body (WB) coil 12, and these components are housed in a cylindrical housing. The bed 50 includes a bed body 52 and a table 51.

The control cabinet 300 includes three gradient coil power supplies 31 (31 *x* for an X-axis, 31 *y* for a Y-axis, and 31 *z* for a Z-axis), a coil selection circuit 36, an RF receiver 32, an RF transmitter 33, and a sequence controller 34.

The console 40 includes processing circuitry 45, a memory 41, a display 42, and an input interface 43. The console 40 functions as a host computer.

The static magnetic field magnet 10 of the gantry 100 is substantially in the form of a cylinder and generates a static magnetic field inside a bore into which an object such as a patient is transported. The bore is a space inside the cylindrical structure of the gantry 100. The static magnetic field magnet 10 includes a superconducting coil inside, and the superconducting coil is cooled down to an extremely low temperature by liquid helium. The static magnetic field magnet 10 generates a static magnetic field by supplying the superconducting coil with an electric current provided from a static magnetic field power supply (not shown) in an excitation mode. Afterward, the static magnetic field magnet 10 shifts to a permanent current mode, and the static magnetic field power supply is separated. Once it enters the permanent current mode, the static magnetic field magnet 10 continues to generate a strong static magnetic field for a long time, for example, over one year. In FIG. 3, the black circle on the chest of the object indicates the magnetic field center.

The gradient coil 11 is also substantially in the form of a cylinder and is fixed to the inside of the static magnetic field magnet 10. This gradient coil 11 applies gradient magnetic fields (for example, gradient pulses) to the object in the respective directions of the X-axis, the Y-axis, and the Z-axis, by using electric currents supplied from the gradient coil power supplies 31 *x*, 31 *y*, and 31 *z*.

The bed body 52 of the bed 50 can move the table 51 in the vertical direction and in the horizontal direction. The bed body 52 moves the table 51 with an object placed thereon to a predetermined height before imaging. Afterward, when the object is imaged, the bed body 52 moves the table 51 in the horizontal direction so as to move the object to the inside of the bore.

The WB body coil 12 is shaped substantially in the form of a cylinder so as to surround the object and is fixed to the inside of the gradient coil 11. The WB coil 12 applies RF pulses transmitted from the RF transmitter 33 to the object. Further, the WB coil 12 receives magnetic resonance signals, i.e., MR signals emitted from the object due to excitation of hydrogen nuclei.

The MRI apparatus 1 may include the RF coils 20 as shown in FIG. 3 in addition to the WB coil 12. Each of the RF coils 20 is a coil placed close to the body surface of the object. There are various types for the RF coils 20. For example, as the types of the RF coils 20, as shown in FIG. 3, there are a body coil attached to the chest, abdomen, or legs of the object and a spine coil attached to the back side of the object. As another type of the RF coils 20, for example, there is a head coil for imaging the head of the object. Although most of the RF coils 20 are coils dedicated for reception, some of the RF coils 20 such as the head coil are a type that performs both transmission and reception. The RF coils 20 are configured to be attachable to and detachable from the table 51 via a cable.

The RF transmitter 33 generates each RF pulse on the basis of an instruction from the sequence controller 34. The generated RF pulse is transmitted to the WB coil 12 and applied to the object. An MR signal is generated from the object by the application of one or plural RF pulses. Each MR signal is received by the RF coils 20 or the WB coil 12.

The MR signals received by the RF coils 20 are transmitted to the coil selection circuit 36 via cables provided on the table 51 and the bed body 52. The MR signals received by the WB coil 12 are also transmitted to the coil selection circuit 36.

The coil selection circuit 36 selects MR signals outputted from each RF coil 20 or MR signals outputted from the WB coil depending on a control signal outputted from the sequence controller 34 or the console 40.

The selected MR signals are outputted to the RF receiver 32. The RF receiver 32 performs analog to digital (AD) conversion on the MR signals, and outputs the converted signals to the sequence controller 34. The digitized MR signals are referred to as raw data in some cases. The AD conversion may be performed inside each RF coil 20 or inside the coil selection circuit 36.

The sequence controller 34 performs a scan of the object by driving the gradient coil power supplies 31, the RF transmitter 33, and the RF receiver 32 under the control of the console 40. When the sequence controller 34 receives raw data from the RF receiver 32 by performing the scan, the sequence controller 34 transmits the received raw data to the console 40.

The sequence controller 34 includes processing circuitry (not shown). This processing circuitry is configured as, for example, a processor for executing predetermined programs or configured as hardware such as a field programmable gate array (FPGA) or an application specific integrated circuit (ASIC).

The console 40 includes the memory 41, the display 42, the input interface 43, and the processing circuitry 45 as described above.

The memory 41 is a recording medium including a read-only memory (ROM) and a random access memory (RAM) in addition to an external memory device such as a hard disk drive (HDD) and an optical disc device. The memory 41 stores various programs executed by a processor of the processing circuitry 45 as well as various types of data and information.

The input interface 43 includes various devices for an operator to input various types of information and data, and is configured of a mouse, a keyboard, a trackball, and/or a touch panel, for example.

The display 42 is a display device such as a liquid crystal display panel, a plasma display panel, and an organic EL panel.

The processing circuitry 45 is a circuit equipped with a central processing unit (CPU) and/or a special-purpose or general-purpose processor, for example. The processor implements various functions described below (e.g. method 400) by executing the programs stored in the memory 41. The processing circuitry 45 may be configured as hardware such as an FPGA and an ASIC. The various functions described below can also be implemented by such hardware. Additionally, the processing circuitry 45 can implement the various functions by combining hardware processing and software processing based on its processor and programs.

Figure 4:
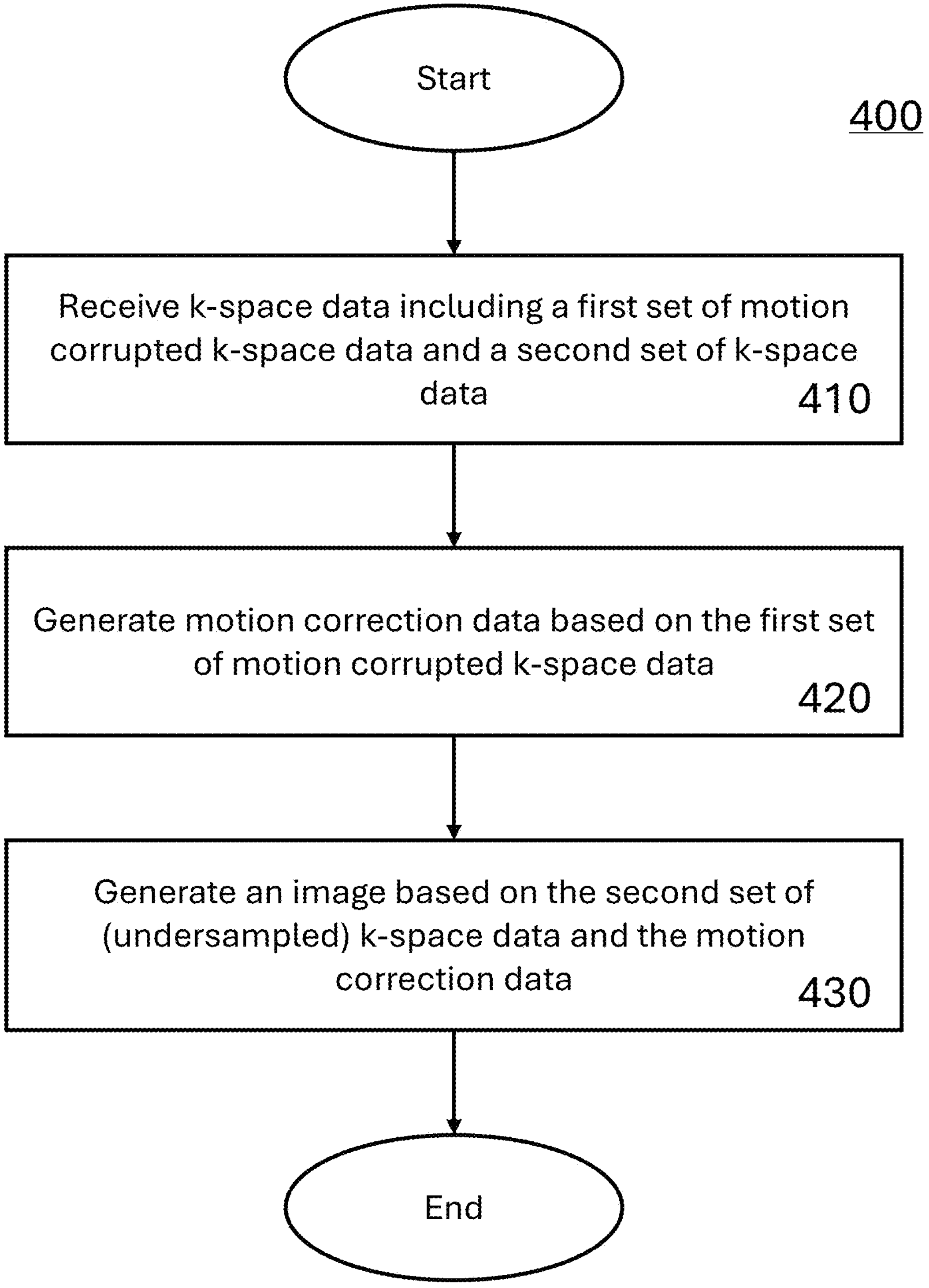
FIG. 4 is a flowchart showing a generalized process as described herein of generating an image from k-space data including a first set of motion corrupted k-space data and a second set of undersampled k-space data by (a) generating motion correction data based on the first set of motion corrupted k-space data and (b) generating the image based on the second set of undersampled k-space data and the motion correction data.

FIG. 4 is a flowchart showing a generalized process as described herein. In method 400, the process begins in step 410 by receiving k-space data including a first set of motion corrupted k-space data and a second set of k-space data, different from the first set. The first and second sets of k-space data each may be undersampled k-space data, parallel sampled data or fully sampled k-space data. In step 420, motion correction data is generated based on the first set of motion corrupted k-space data. The motion correction data may be information (1) (e.g., GRAPPA weights or a sensitivity map such as an ESPIRiT map) to aid in (1a) generating interpolated data to "fill in" missing k-space data and/or (1b) undersampled reconstruction, (2) new k-space data to replace all or part of the first set of motion corrupted k-space data, or (3) a combination of the (1) and (2). In step 430, a spatial image is generated based on the second set of k-space data and the motion correction data (e.g., using undersampled reconstruction or a full reconstruction). In an embodiment where the second set of k-space data is undersampled k-space data, the method may "fill in" the missing k-space data by using interpolation to generate interpolated k-space data from the second set of k-space data (and potentially the motion correction data (e.g., a sensitivity map)). In such an embodiment, the spatial image is generated based on the second set of k-space data, the interpolated k-space data (e.g., generated using a sensitivity map), and the motion correction data.

Figure 5A:
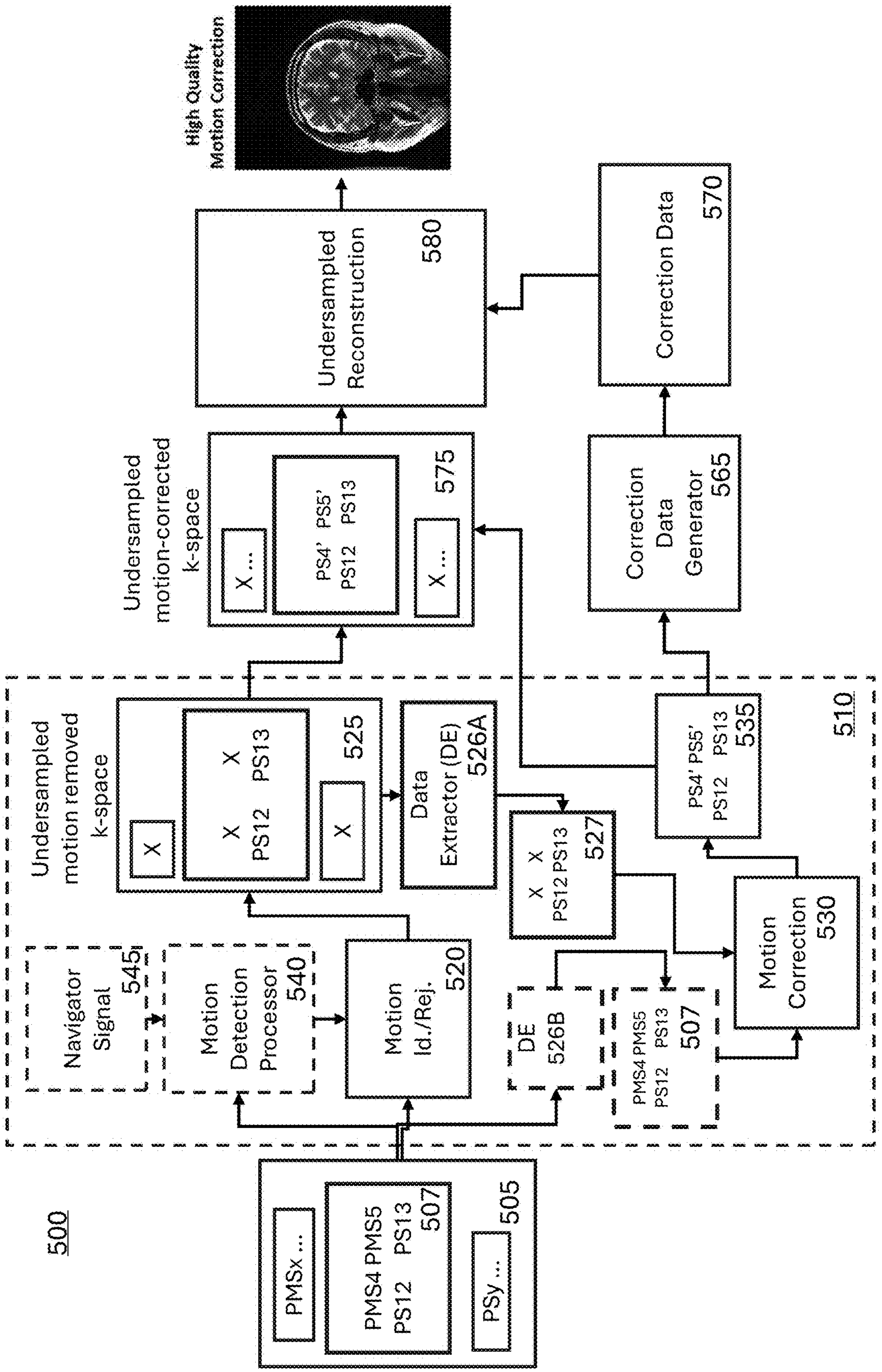
FIG. 5A is a block diagram showing an image generation architecture that utilizes undersampled reconstruction based on a motion corrected ACS resulting in higher image quality.

FIG. 5A is a block diagram showing a general image generation architecture for implementing the method of FIG. 4. The system 500 (and its associated methods and/or computer program products) utilizes undersampled reconstruction 580 based on a motion corrected first set of k-space data that is used to correct a second set of undersampled k-space data resulting in higher image quality. Alternatively, sampled data can be reconstructed if the second set of k-space data is fully sampled k-space. As shown in FIG. 5A, an initial set of k-space data 505 is received within the system 500 (as in Step 410 of FIG. 4) and includes a first set of motion-corrupted k-space data 507 as well as a second set of k-space data outside the first set. The first set of motion-corrupted k-space data 507 is illustrated as including central lines/frequencies with illustrated k-space points having sampled magnitudes and phases S4, S5, S12, and S13, but additional lines can be included within this first set (e.g., all the lines of an ACS, most of the lines of an ACS, or substantially all (such as 90%) of the lines of an ACS). The k-space points having sampled magnitudes and phases S4 and S5 are indicated (by being labeled "M") as having been detected as having been sampled in the presence of motion. Alternatively, the existence of motion in various lines/points can be detected post processing using a motion detection processor 540 as is discussed in further detail below. In some embodiments, the motion detection processor 540 utilizes a navigator signal 545 to control or aid in the detection of motion.

K-space pre-processor 510 (including motion identification/rejection circuitry 520) operates on the received set of k-space data 505 to produce a motion-removed set of k-space data 525 (including, but not limited to, from the first set of motion-corrupted k-space data 507). As illustrated, the points having motion in the first set of motion-corrupted k-space data 507 have been removed (and replaced with an "X" because they were indicated as having motion during acquisition). PMSx (and related points) also were removed (and replaced with an "X" because they were indicated as having motion during acquisition). PSy (and related points), although not indicated as having had motion during acquisition, were determined to have been acquired in the presence of motion, e.g., using a navigator signal. Similarly, lines from the first set of motion-corrupted k-space data 507 can be removed due to motion after obtaining the k-space image data if detected post-sampling to have been corrupted by motion. The resulting motion-removed set of k-space data 525 is undersampled.

The output of the motion identification/rejection circuitry 520 is processed by data extractor (DE) 526A circuitry to produce a subset of the motion-removed set of k-space data 525 (as a central set of motion-removed k-space data 527). The central set of motion-removed k-space data 527 is provided to circuitry for motion correction 530. The amount of data to be processed as the central set of motion-removed k-space data 527 may either be a fixed size (e.g., all of the ACS data) or may be variable (e.g., by calculating a size of the data needed to represent a threshold amount of the total energy of the set of k-space data 505, such as 80%, 90% or 95%). In some embodiments, a second data extractor 526B extracts the first set of motion-corrupted k-space data 507 without relying on the motion identification/rejection circuitry 520.

The central set of motion-removed k-space data 527 undergoes motion correction 530 to produce a first set of motion corrected k-space data 535 (as in Step 420 of FIG. 4) (potentially using the extracted first set of motion-corrupted k-space data 507 also). The first set of motion corrected k-space data 535 can then be used by a correction data generator 565 to generate correction data 570 that is used as part of an undersampled reconstruction 580.

Figure 5B:
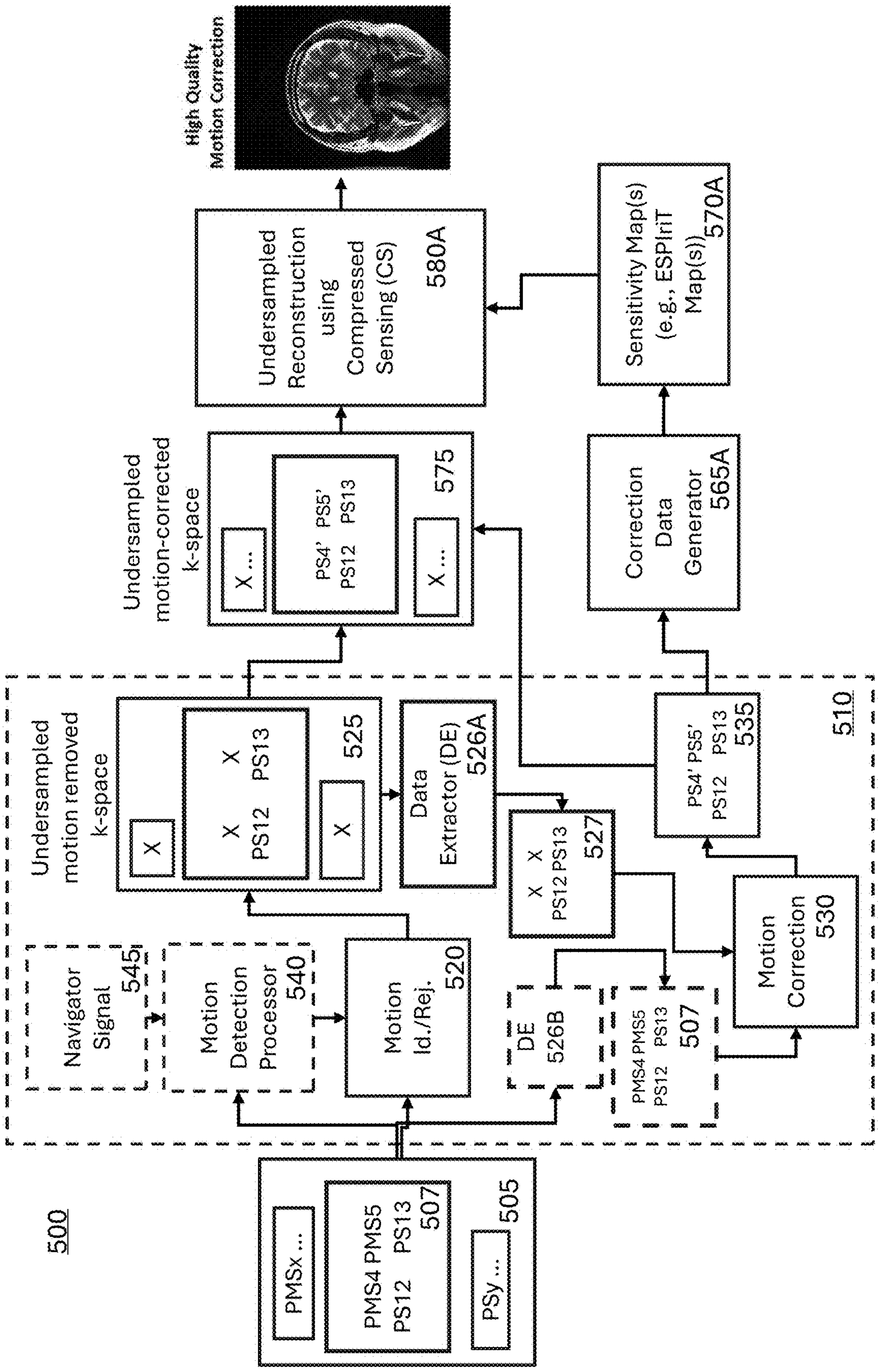
FIG. 5B is a block diagram showing an image generation architecture of FIG. 5A that utilizes compressed sensing (CS) undersampled reconstruction using a sensitivity map as correction data.
Figure 5C:
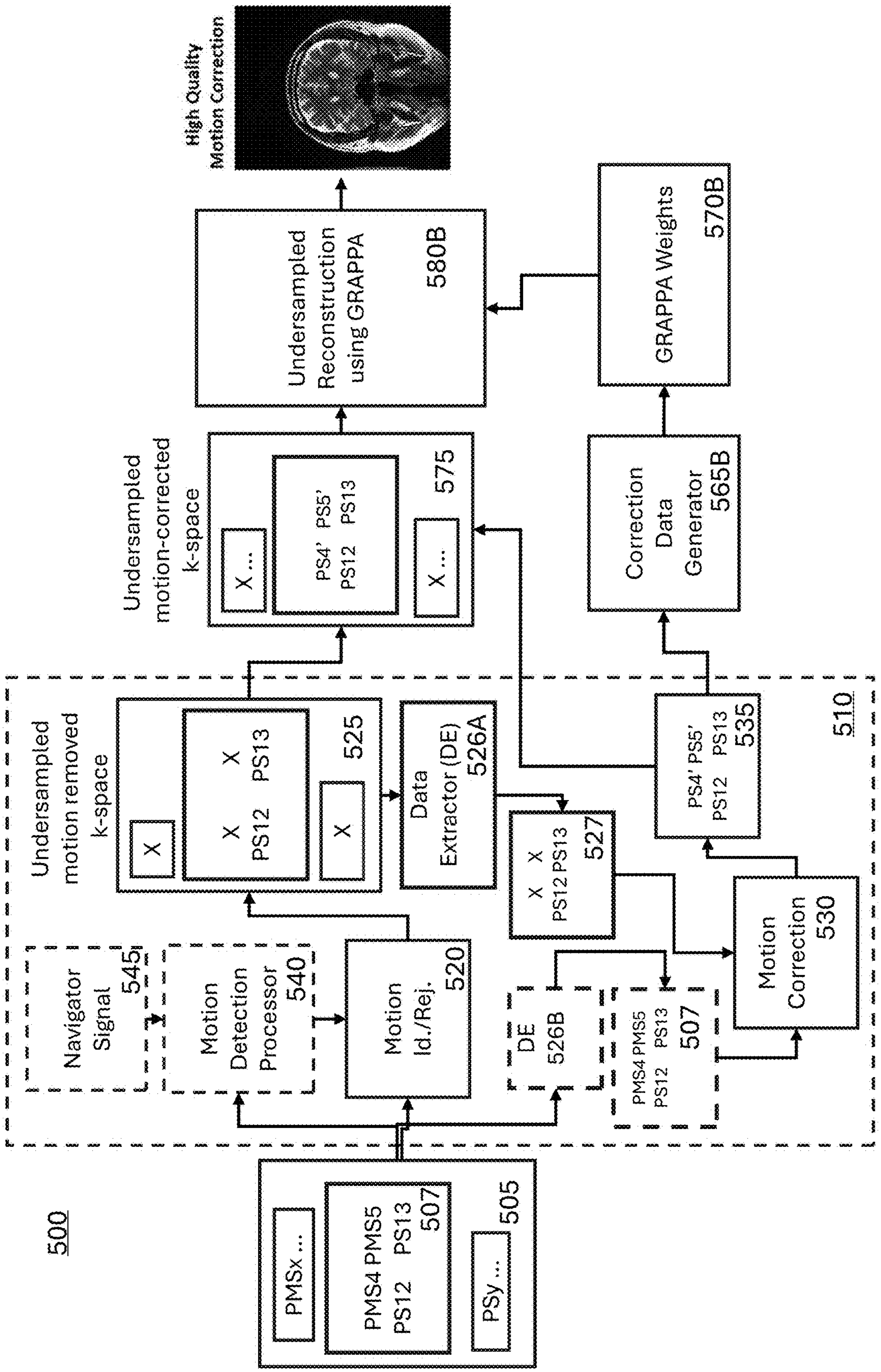
FIG. 5C is a block diagram showing an image generation architecture of FIG. 5A that utilizes GRAPPA undersampled reconstruction using GRAPPA weights as correction data.
Figure 5D:
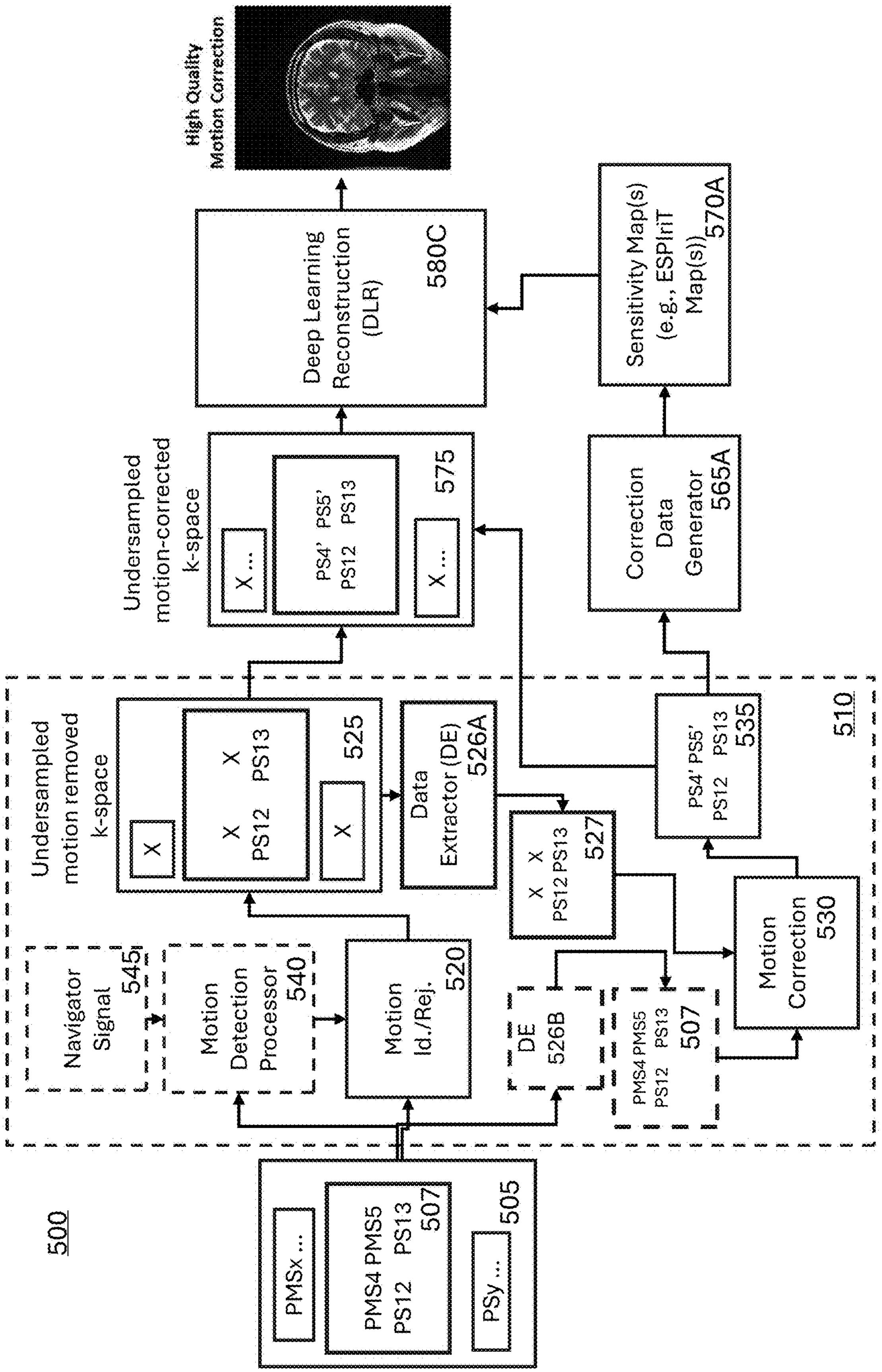
FIG. 5D is a block diagram showing an image generation architecture of FIG. 5A that utilizes deep learning undersampled reconstruction (DLR) using a sensitivity map (e.g., an ESPiRIT) as correction data.

As illustrated in FIG. 5A, the first set of motion corrected k-space data 535 replaces a portion of the motion-removed set of k-space data 525 to produce a combined undersampled motion-corrected k-space data 575. The undersampled motion-corrected k-space data 575 then undergoes undersampled reconstruction 580 (using the correction data 570) to produce a spatial image (as in Step 420 of FIG. 4). Correction data may, for example, be generated by correction data generator 565A and be in the form of a sensitivity map 570A (such as an ESPIRiT map) as shown in FIG. 5B. In such a case, the undersampled reconstruction may be implemented as a compressed sensing (CS) reconstruction 580A (FIG. 5B) or deep learning (DLR) 580C (FIG. 5D), and the image is generated based on the ESPIRiT map and the CS reconstruction 580A or the DLR reconstruction 580C, respectively. Alternatively, correction data may, for example, be generated by correction data generator 565B and be in the form of a set of GRAPPA weights 570B as shown in FIG. 5C. In such a case, the undersampled reconstruction may be implemented as a GRAPPA reconstruction 580B. The undersampled reconstruction 580 may itself include motion compensation processing on the combined undersampled motion-corrected k-space data 575 (e.g., including the first set of motion corrected k-space data 535 acting as ACS data).

As discussed above, a motion detection processor 540 can be used to facilitate motion identification and/or rejection (either line by line or for all lines in an imaging shot). Navigator data can be acquired during every imaging shot, and navigators can be 3D volumes, 2D images or 1D signals. Navigators can be obtained from a variety of different sources such as: (1) Non-imaging k-space echoes inserted into the pulse sequence, (2) Respiratory bellows, (3) ECG for cardiac motion, (4) cameras with and without external markers, and/or (5) pilot-tone based motion detection. Navigator information can be used to detect motion in both ACS and imaging data.

Figure 6B:
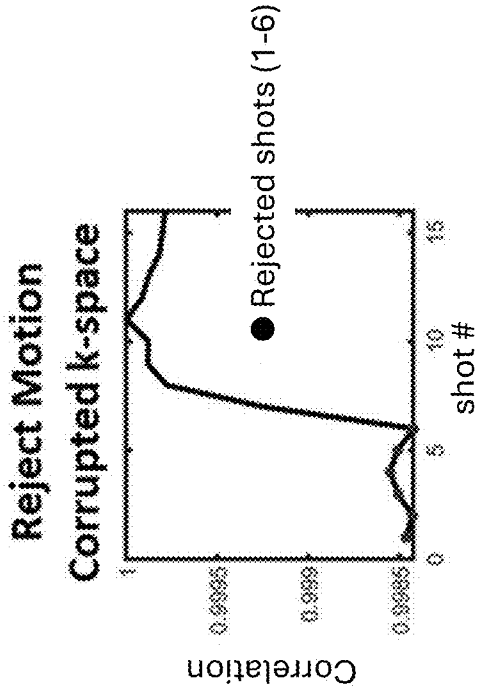
FIG. 6B is an annotated plot of correlation information of navigators from the series of shots of FIG. 6A and annotated with an indication of the shots that are rejected due to low correlation values.
Figure 6A:
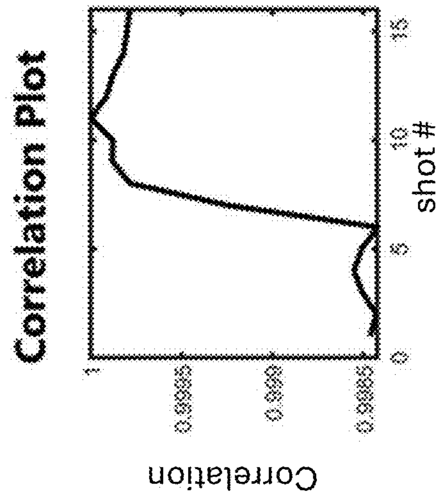
FIG. 6A is a plot of correlation information of navigators from a series of shots.

As shown in FIGS. 6A and 6B, one method of determining motion utilizes correlation information (e.g., as can be represented in a plot) of navigators derived from non-imaging k-space echoes (e.g., orientated along Readout (RO) and Phase Encoding (PE)) collected on a shot basis. In one such embodiment, the inverse Fourier transform of the navigator k-space is obtained. The correlation is then obtained between each navigator signal and a reference navigator (correlation plot) as shown in FIG. 6A. Shots with correlation values less than a threshold (a) are rejected as being shots with motion as shown in FIG. 6B. Thresholds can be determined using a variety of methods, including empirically. For example, an absolute threshold can be used such that shots having correlation less than $\alpha$ (e.g., 0.999) are treated as motion corrupted (as are shots 1-6 in FIG. 6B). Alternatively, a standard deviation can be used such that shots having a correlation less than ($\mu-\alpha*\sigma$) are treated as motion corrupted, where mean ($\mu$) and standard deviation ($\sigma$) can be calculated using correlation of all shots or a subset of shots. To avoid over-removing corrupted portions before reconstructing the central portions (e.g., the ACS portion), a limit may be applied to the total number of shots that can be designated as corrupted. For example, a total number of shots treated as corrupted may be limited to being less than $\alpha$*total number of shots. In such an embodiment, if there are more than ($\alpha$*total number of shots) shots that could be treated as motion corrupted, the shots to be treated as motion corrupted may be selected randomly, on a first found-first marked basis, or by selecting the ($\alpha$*total number of shots) shots with the lowest correlation values as the shots to be treated as motion corrupted. Additionally, to avoid creating large gaps in k-space after shot rejection before reconstructing the central portions (e.g., the ACS portion), a limit may be applied on the maximum undersampled gap size produced in k-space by shot rejection. A combination of those thresholding methods also can be used.

Figure 7A:
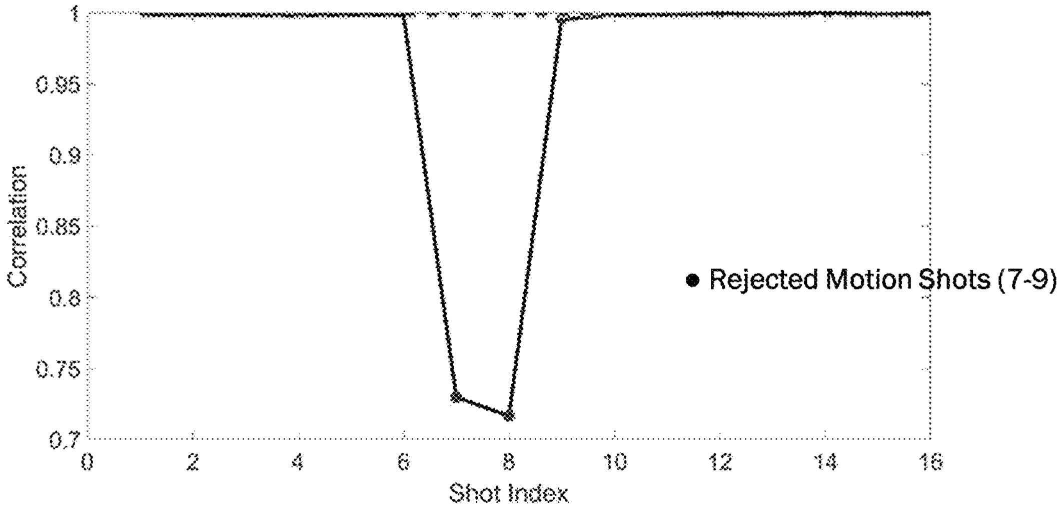
FIG. 7A is an additional annotated plot of correlation information of navigators corresponding to the images of FIGS. 7B and 7D and annotated with an indication of the shots that are rejected due to low correlation values.
Figure 7B:
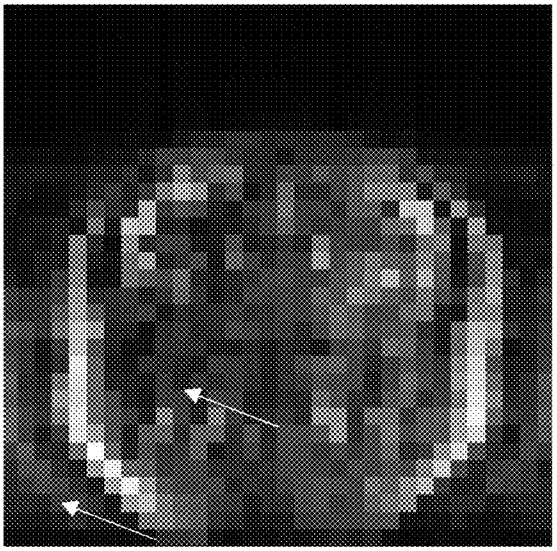
FIG. 7B is an ACS (sum of squares) image corresponding to the correlation information for the scan of FIG. 7A that includes motion corruption in the ACS information.
Figure 7C:
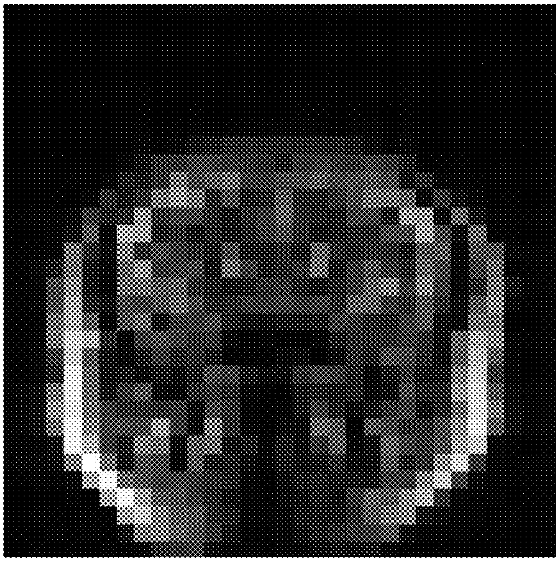
FIG. 7C is an ACS motion-corrected version of FIG. 7B.
Figure 7D:
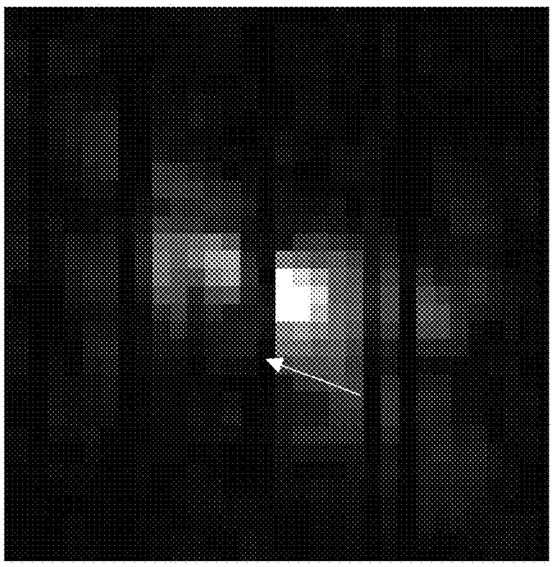
FIG. 7D is pictorial representation of ACS k-space data from an ACS k-space coil but including motion corruption in the ACS information.
Figure 7E:
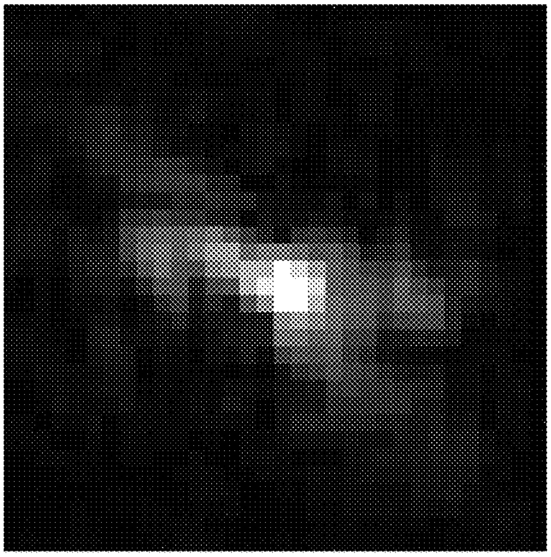
FIG. 7E is an ACS motion-corrected version of FIG. 7D.

FIG. 7A shows a second exemplary correlation plot showing motion in the ACS of k-space imaging data a T2w FSE brain scan. Due to their correlation values, shots 7, 8 and 9 (and their corresponding lines) are rejected as including motion. FIG. 7B shows an ACS (sum of squares) image corresponding to the correlation information for the scan of FIG. 7A that includes motion corruption in the ACS information as is identified by the arrows in FIG. 7B. The motion also can be seen identified by the arrow in FIG. 7D which represents ACS data from an ACS k-space coil. After ACS motion correction processing (step 420) using a GRAPPA approach described in greater detail below, the ACS image and ACS k-space coil data are improved, as shown in FIGS. 7C and 7E, respectively.

Motion detection also can be performed using a deep learning-based (DL-based) classification. Deep learning can detect motion-corrupted imaging shots using correlation plots or raw navigator signal by training a DL network with simulated motion. In one such embodiment, the DL network is trained by (1) selecting navigator data to be corrupted with rigid-body motion, (2) select shots that will be corrupted with through-plane motion (e.g., as simulated intensity changes in navigator signals), and (3a) if DL is applied directly to navigator signal, the navigator signals will serve as inputs to the DL network and a list of navigator signals with motion will serve as outputs from the DL network or (3b) if DL is applied to correlation plots, the correlation plots will serve as inputs to the DL network and a list of motion corrupted shots will serve as outputs from the DL network. In step (1), translation and rotation can be simulated for 3D and 2D navigators, and translation along the readout direction can be simulated for 1D navigators.

Figure 8A:
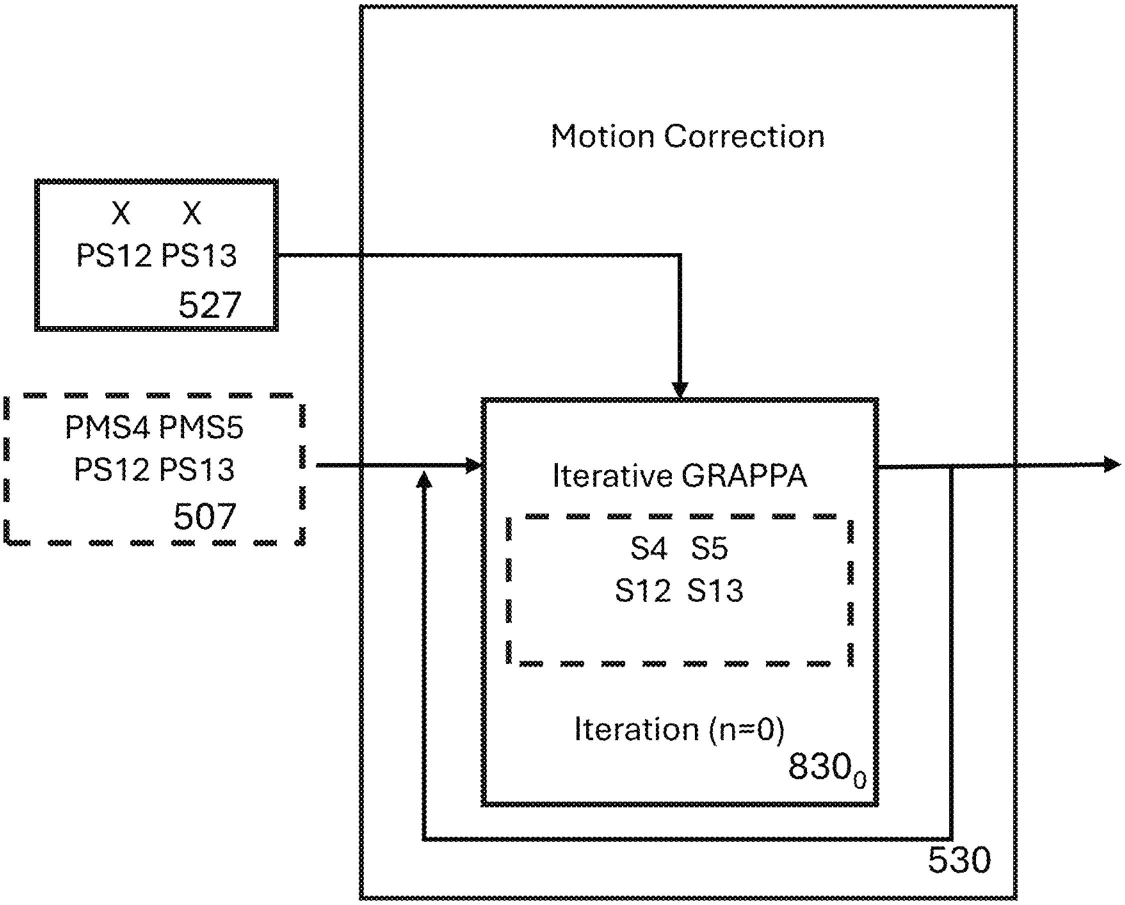
FIGS. 8A-8C are block diagrams of internals of motion correction circuitry according to a first embodiment at three different iterations of a GRAPPA reconstruction.
Figure 8B:
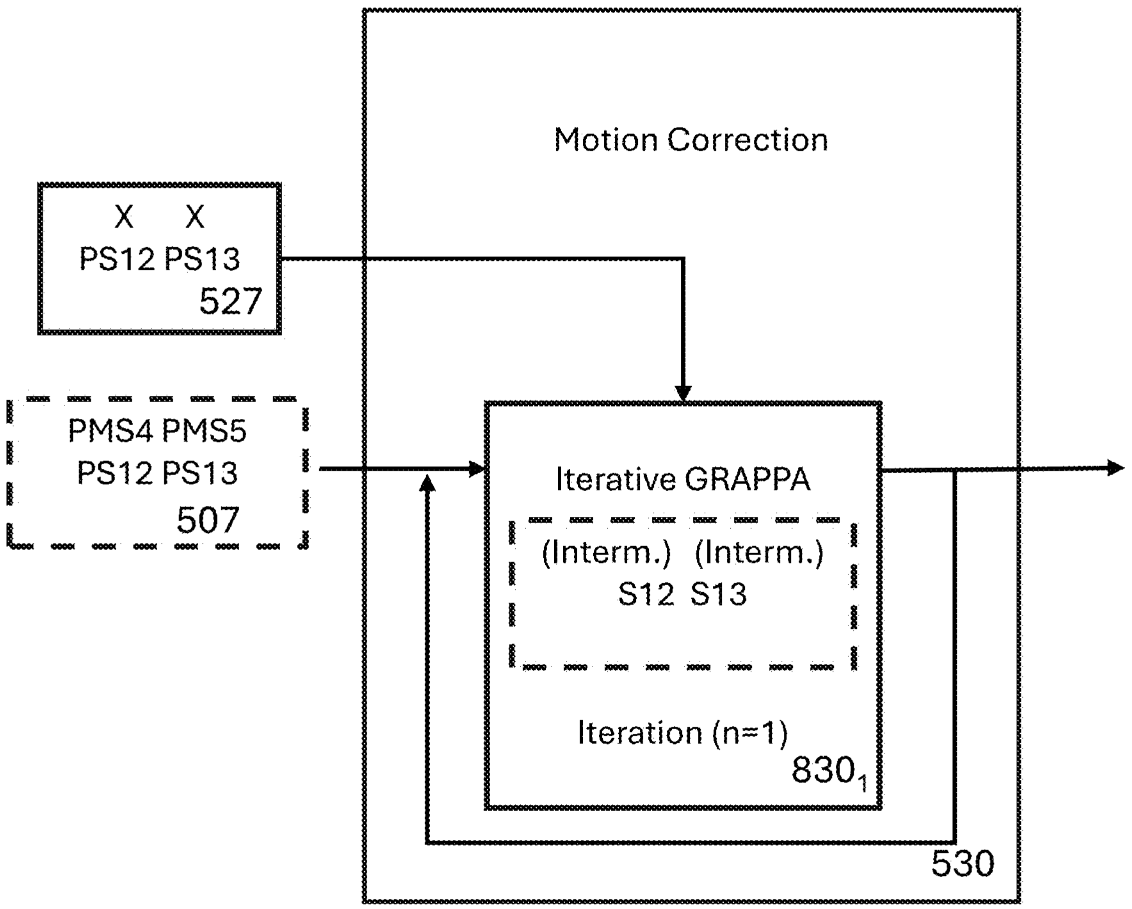
Figure 8C:
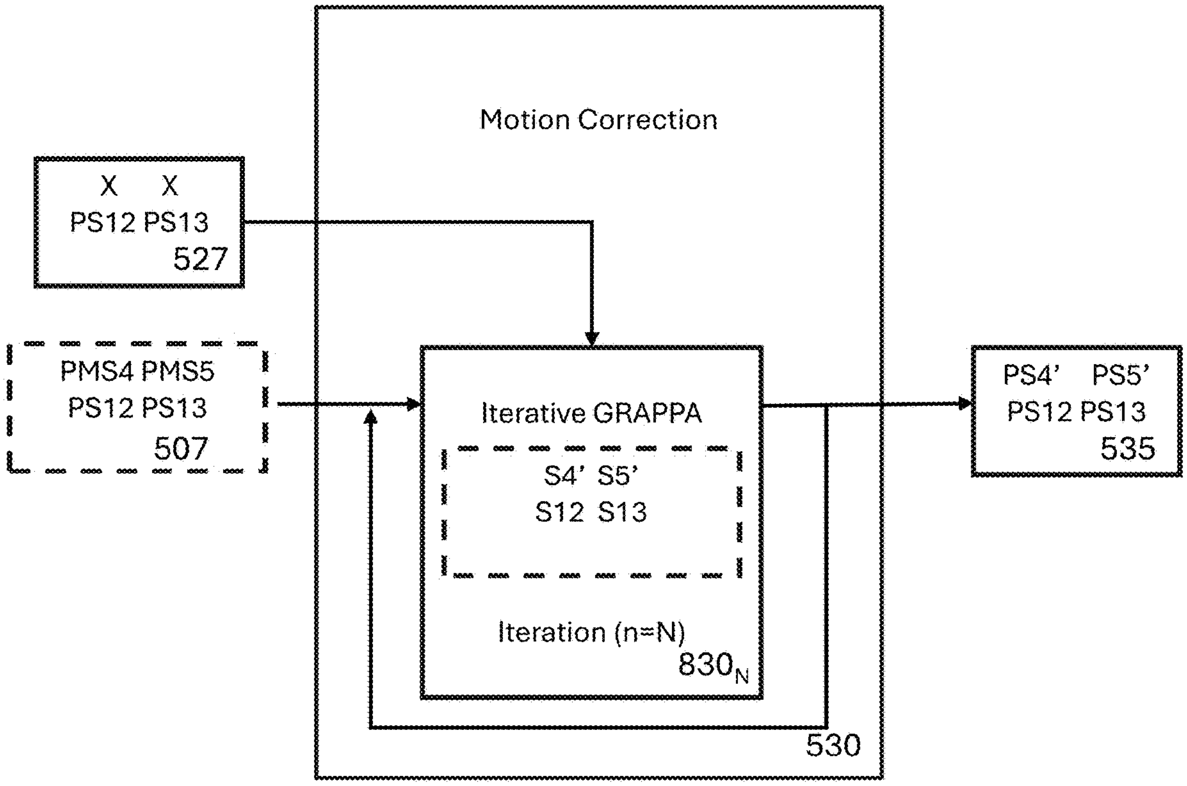

As discussed above with respect to step 420 and the motion correction 530 of FIGS. 5A and 5B, motion correction can be applied to a first set of motion-corrupted k-space data 507. FIGS. 8A-8C show a block diagram of internals of motion correction 530 according to one embodiment at three different iterations of a GRAPPA reconstruction. FIG. 8A corresponds to an initial setup (iteration 0) of the GRAPPA reconstruction, and the first set of motion-corrupted k-space data 507 is used an initial estimate of the GRAPPA weights 8300 for undersampled ACS recon (ACS(0)). In addition, the central set of motion-removed (undersampled) k-space data 527 is treated as a GRAPPA input that will be referred to as Z in the equations below. Then for successive iterations (where n increments from 1 to N), the current GRAPPA weights $\mathbf{830}_n$ are replaced with new weights $\mathbf{830}_{n+1}$ according to a weighted combination such as:

$$ACS(n)=(1-\alpha)*ACS(n-1)+\alpha*\text{GRAPPA}(Z,ACS(n-1)),\quad \text{where } 0\le\alpha\le 1.$$

As shown in FIG. 8C, after the final iteration (n=N), ACS(N) is equal to the first set of motion corrected k-space data 535. Iterative GRAPPA processes, such as those disclosed above, are disclosed in Zhao, T., & Hu, X. (2008). Iterative GRAPPA (iGRAPPA) for improved parallel imaging reconstruction. Magnetic Resonance in Medicine: An Official Journal of the International Society for Magnetic Resonance in Medicine, 59(4), 903-907, the contents of which are incorporated herein by reference.

Figure 9:
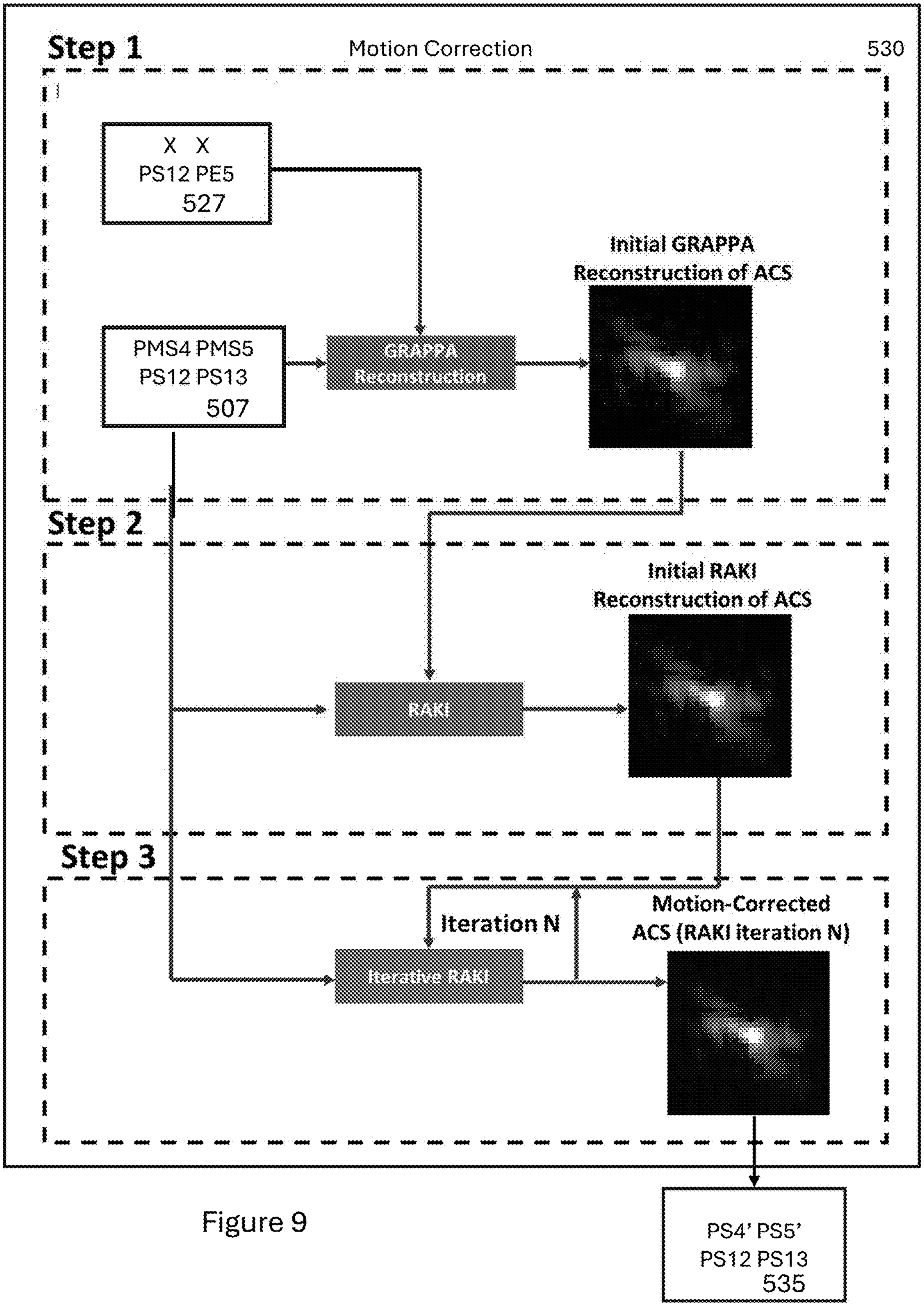
FIG. 9 is a block diagram of motion correction circuitry according to a second embodiment using a multi-step GRAPPA/RAKI process.

As shown in FIG. 9, in an alternate embodiment, motion correction 530 is implemented in a multi-step process. In an initial step, like with the initial iteration of FIG. 8A, the first set of motion-corrupted k-space data 507 and the central set of motion-removed (undersampled) k-space data 527 are applied to a GRAPPA reconstruction to generate an initial GRAPPA reconstruction of the first set of k-space data. The initial GRAPPA reconstruction of the first set of k-space data is then used along with the first set of motion-corrupted k-space data 507 to produce an initial RAKI reconstruction of the first set of k-space data. Iterative reconstructions are then performed for a total of N iterations to produce the first set of motion corrected k-space data 535. In each iteration of the iterative RAKI process, the weights of a convolution neural network (CNN) are further refined using the current iteration of the first set of k-space data (as has been corrected so far). Iterative RAKI processing is described in Dawood, P. et al., Iterative training of robust k-space interpolation networks for improved image reconstruction with limited scan specific training samples. Magnetic Resonance in Medicine, 89(2), 812-827 (2023), the contents of which are incorporated herein by reference.

Figure 10:
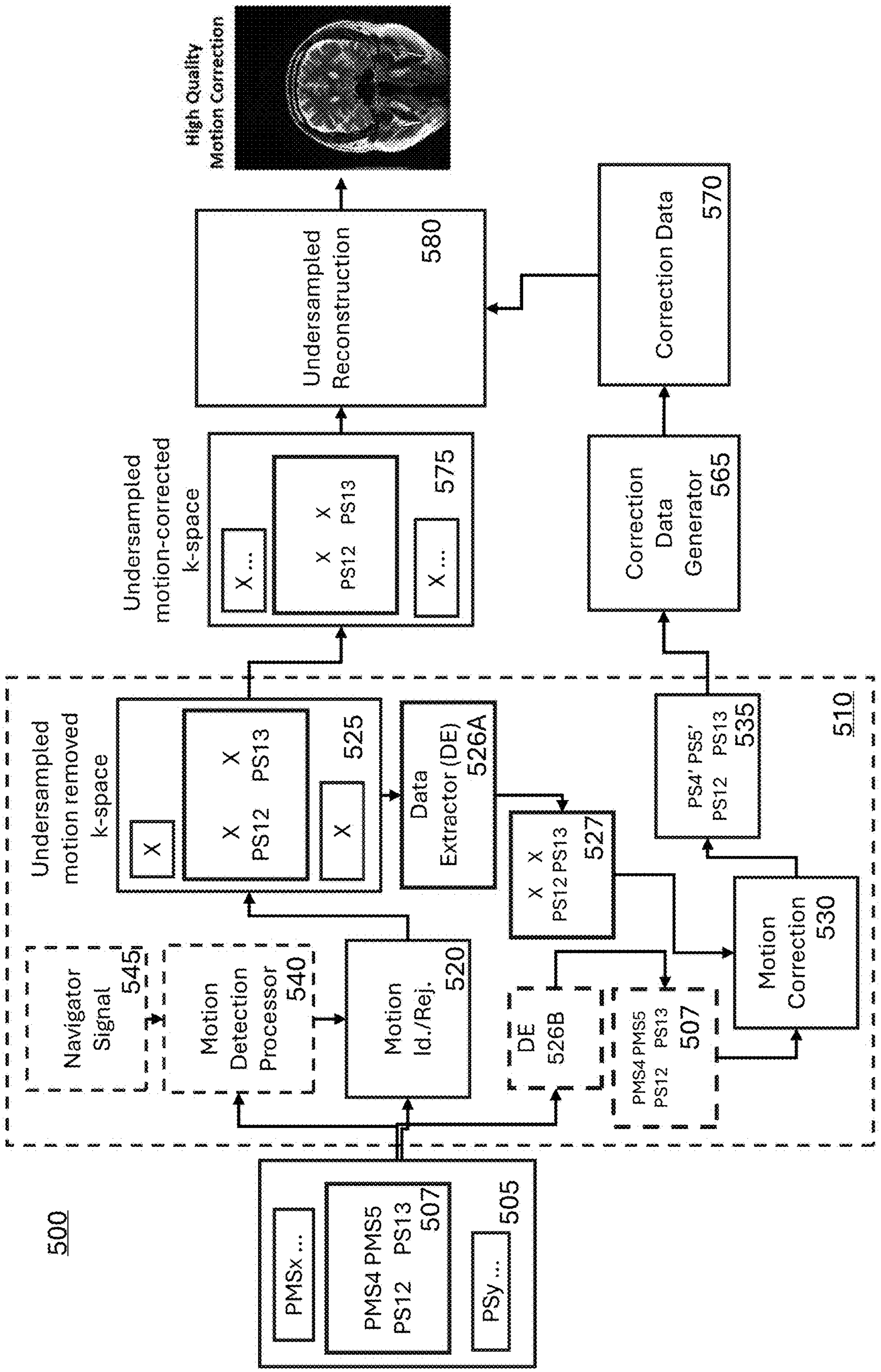
FIG. 10 is a block diagram showing an alternate image generation architecture that utilizes undersampled reconstruction based on a motion corrected ACS.

In an alternate embodiment shown in FIG. 10, the system 500 does not produce a combined undersampled motion-corrected k-space data 575 as in FIG. 5A. Instead, the motion-removed set of k-space data 525 is applied directly to the undersampled reconstruction 580 (which may include motion compensation) that uses the correction data 570.

Figure 11C:
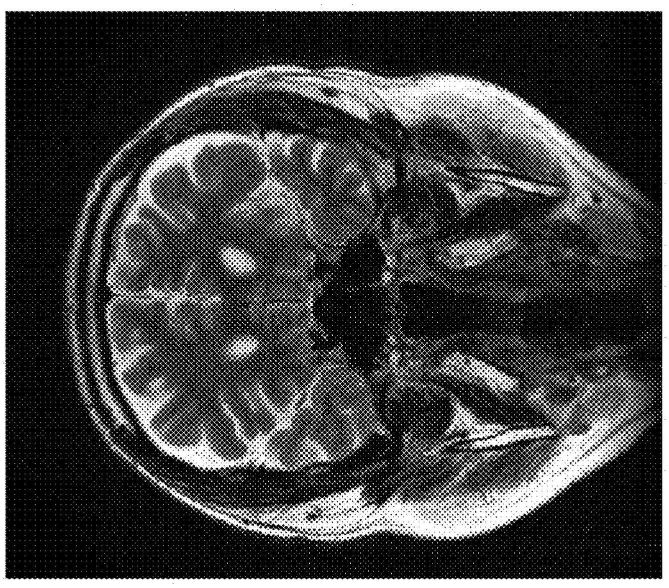
FIG. 11C is an image resulting from performing a separate motion correction on the ACS k-space data corresponding to FIG. 11A prior to performing motion correction on the combined motion-corrected ACS k-space data and the non-ACS k-space data before performing an undersampled CS reconstruction on the motion corrected combined k-space data.
Figure 11B:
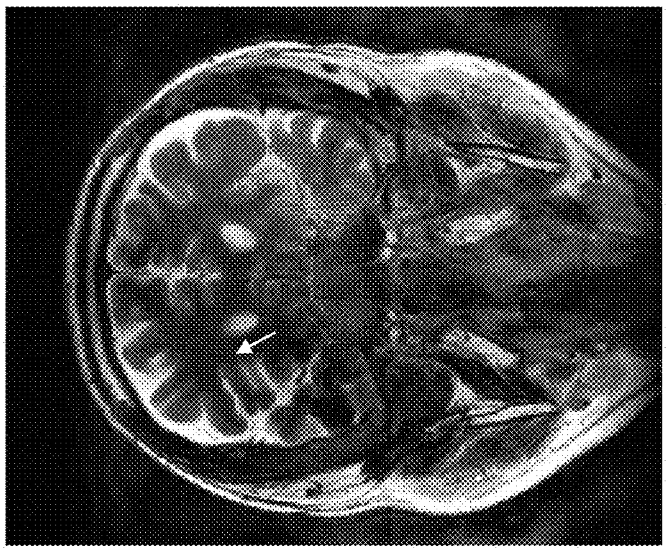
FIG. 11B is an image resulting from performing motion correction on the set of motion-corrupted k-space data corresponding to FIG. 11A prior to performing an undersampled CS reconstruction.
Figure 11A:
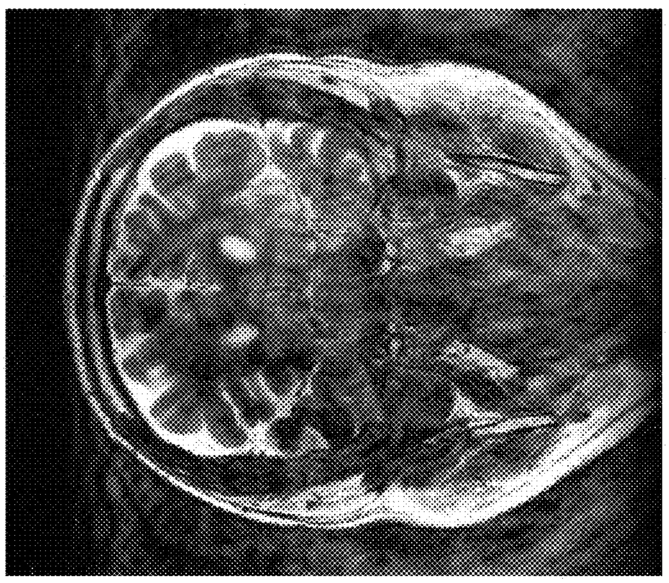
FIG. 11A is an image generated using an undersampled compressed sensing (CS) reconstruction on a set of motion-corrupted k-space data.

As shown in FIGS. 11A-11C, the motion correction of the first set of motion-corrupted k-space data 507 prior to an undersampled reconstruction (or a full reconstruction) can improve image quality when using CS reconstruction. FIG. 11A shows an image produced from motion corrupted k-space data from a T2 W FSE brain scan that underwent CS reconstruction. FIG. 11B shows the resultant image when the first set of motion-corrupted ACS k-space data 507 was used in an undersampled reconstruction using a compressed sense (CS) reconstruction after shot rejection. Lastly, as shown in FIG. 11C, the highest image quality was achieved by performing a separate motion correction on the ACS k-space data corresponding to FIG. 11A prior to performing motion correction on the combined motion-corrected ACS k-space data and the non-ACS k-space data before performing an undersampled CS reconstruction on the motion corrected combined k-space data.

Figure 12C:
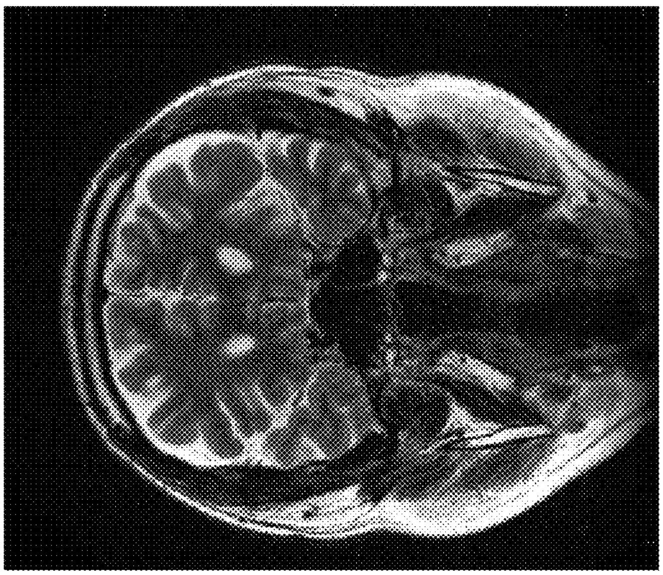
FIG. 12C is an image resulting from performing a separate motion correction on the ACS k-space data corresponding to FIG. 12A prior to performing motion correction on the combined motion-corrected ACS k-space data and the non-ACS k-space data before performing a GRAPPA reconstruction on the motion corrected combined k-space data.
Figure 12B:
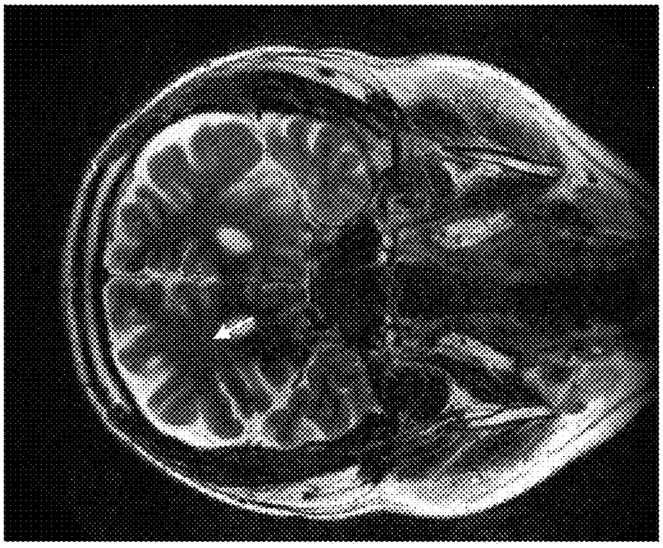
FIG. 12B is an image resulting from performing motion correction (shot rejection) on the set of motion-corrupted k-space data corresponding to FIG. 12A prior to performing a GRAPPA reconstruction.
Figure 12A:
FIG. 12A is an image generated using a GRAPPA reconstruction on a set of motion-corrupted k-space data.

As shown in FIGS. 12A-12C, the motion correction of the first set of motion-corrupted k-space data 507 prior to an undersampled reconstruction (or fully sampled reconstruction) can improve image quality when using GRAPPA reconstruction also. FIG. 12A shows an image (produced from the same motion corrupted k-space data from the T2 W FSE brain scan of FIG. 11A) by utilizing a GRAPPA reconstruction. FIG. 12B shows the resultant image when the first set of motion-corrupted ACS k-space data 507 was used in an undersampled reconstruction using GRAPPA reconstruction after shot rejection. Lastly, as shown in FIG. 12C, the highest image quality was achieved by performing motion correction on the ACS k-space data corresponding to FIG. 12A prior to performing motion correction on the combined motion-corrected ACS k-space data and the non-ACS k-space data before performing an undersampled GRAPPA reconstruction on the motion corrected combined k-space data.

The methods and systems described herein can be implemented in a number of technologies but generally relate to imaging devices and processing circuitry for performing the processes described herein. In one embodiment, the processing circuitry (e.g., image processing circuitry and controller circuitry) is implemented as one of or as a combination of: an application specific integrated circuit (ASIC), a field programmable gate array (FPGA), a generic array of logic (GAL), a programmable array of logic (PAL), circuitry for allowing one-time programmability of logic gates (e.g., using fuses) or reprogrammable logic gates. Furthermore, the processing circuitry can include a computer processor and having embedded and/or external non-volatile computer readable memory (e.g., RAM, SRAM, FRAM, PROM, EPROM, and/or EEPROM) that stores computer instructions (binary executable instructions and/or interpreted computer instructions) for controlling the computer processor to perform the processes described herein. The computer processor circuitry may implement a single processor or multiprocessors, each supporting a single thread or multiple threads and each having a single core or multiple cores.

Embodiments of the present disclosure may also be as set forth in the following parentheticals.

(1) A method of image processing including, but not limited to: (a) receiving k-space data which is acquired by scanning an object by a magnetic resonance imaging apparatus, the k-space data including a first set of motion corrupted k-space data and a second set of k-space data, different from the first set of motion corrupted k-space data; (b) generating motion correction data based on the first set of motion corrupted k-space data and information indicating whether the object moved while scanning the object; and (c) generating an image based on the second set of k-space data and the motion correction data.

(2) The method according to (1), wherein the k-space data corresponding to a movement of the object among the first set of motion corrupted k-space data is not used for generating the motion correction data.

(3) The method according to (2), wherein the motion correction data is generated based on motion-corrected k-space data generated by applying an iterative GRAPPA process to k-space data not corresponding to the movement of the object among the first set of motion corrupted k-space data.

(4) The method according to (2), wherein the motion correction data is generated based on motion-corrected k-space data generated by applying an iterative GRAPPA process and an iterative RAKI process to k-space data not corresponding to the movement of the object among the first set of motion corrupted k-space data.

(5) The method according to any one of (1)-(4), wherein the first set of motion corrupted k-space data is at least one of undersampled k-space data and data acquired by parallel imaging.

(6) The method according to any one of (1)-(5), wherein the first set of motion corrupted k-space data is auto-calibration signal (ACS) data.

(7) The method according to any one of (1)-(6), wherein generating the image based on the second set of k-space data and the motion correction data includes, but not limited to, generating the image based on the motion correction data and data in the second set of k-space data that is not motion corrupted.

(8) The method according to (7), wherein the motion correction data is sensitivity information indicating a sensitivity of each of a plurality of coils which receive magnetic resonance signals from the object, and wherein generating the image based on the second set of k-space data and the motion correction data includes, but not limited to, generating the image based on the sensitivity information and the data in the second set of k-space data that is not motion corrupted.

(9) The method according to (7), wherein the motion correction data is sensitivity information indicating a sensitivity of each of a plurality of coils which receive magnetic resonance signals from the object, and wherein generating the image based on the second set of k-space data and the motion correction data includes, but not limited to, generating the image based on the sensitivity information and an image generated from the data in the second set of k-space data that is not motion corrupted.

(10) The method according to (7), wherein the motion correction data is a set of GRAPPA weights, and wherein generating the image based on the second set of k-space data and the motion correction data includes, but not limited to, generating the image based on the set of GRAPPA weights and data in the second set of k-space data that is not motion corrupted.

(11) The method according to (7), wherein the motion correction data is a set of GRAPPA weights, and wherein generating the image based on the second set of k-space data and the motion correction data includes, but not limited to, generating the image based on the set of GRAPPA weights and an image generated from data in the second set of k-space data that is not motion corrupted.

(12) The method according to any one of (1) or (2), wherein the second set of k-space data is undersampled k-space data.

(13) The method according to (12), wherein the motion correction data is an ESPIRiT map, and wherein generating the image based on the second set of k-space data and the motion correction data includes, but not limited to, generating the image based on the ESPIRiT map and the second set of undersampled k-space data.

(14) The method according to (12), wherein the motion correction data is an ESPIRiT map, and wherein generating the image based on the second set of k-space data and the motion correction data includes, but not limited to, generating the image based on the ESPIRiT map and an image generated from the second set of undersampled k-space data.

(15) The method according to (12), wherein the motion correction data is a set of GRAPPA weights, and wherein generating the image based on the second set of k-space data and the motion correction data includes, but not limited to, generating the image based on k-space data interpolated by the set of GRAPPA weights and the second set of undersampled k-space data.

(16) The method according to (12), wherein the motion correction data is a set of GRAPPA weights, and wherein generating the image based on the second set of k-space data and the motion correction data includes, but not limited to, generating the image based on k-space data interpolated by the set of GRAPPA weights and an image generated from the second set of undersampled k-space data.

(17) The method according to (12), wherein the motion correction data is sensitivity information indicating a sensitivity of each of a plurality of coils which receive magnetic resonance signals from the object, and wherein generating the image based on the second set of k-space data and the motion correction data includes, but not limited to, generating the image based on the sensitivity information and the second set of undersampled k-space data.

(18) The method according to (12), wherein the motion correction data is sensitivity information indicating a sensitivity of each of a plurality of coils which receive magnetic resonance signals from the object, and wherein generating the image based on the second set of k-space data and the motion correction data includes, but not limited to, generating the image based on the sensitivity information and an image generated from the second set of undersampled k-space data.

(19) The method according to any one of (1)-(18), wherein the information indicating whether the object moved while scanning the object is detected by using navigator signals.

(20) An apparatus for performing image processing, comprising: processing circuitry configured to perform the steps of any one of (1)-(19).

(21) A non-transitory computer-readable storage medium storing computer-readable instructions that, when executed by a computer, cause the computer to perform an image processing method of any one of (1)-(19).

Thus, the foregoing discussion discloses and describes merely exemplary embodiments of the present disclosure. As will be understood by those skilled in the art, the present disclosure may be embodied in other specific forms without departing from the spirit thereof. Accordingly, the disclosure of the present disclosure is intended to be illustrative, but not limiting, of the scope of the disclosure, as well as other claims. The disclosure, including any readily discernible variants of the teachings herein, defines, in part, the scope of the foregoing claim terminology such that no inventive subject matter is dedicated to the public.

The invention claimed is:

1. A method of image processing comprising:

receiving k-space data which is acquired by scanning an object by a magnetic resonance imaging apparatus, the k-space data including a first set of motion corrupted k-space data and a second set of k-space data, different from the first set of motion corrupted k-space data;

generating motion correction data based on the first set of motion corrupted k-space data and information indicating whether the object moved while scanning the object; and generating an image based on the second set of k-space data and the motion correction data, wherein the k-space data corresponding to a movement of the object among the first set of motion corrupted k-space data is not used for generating the motion correction data, and the motion correction data is generated based on motion-corrected k-space data generated by applying an iterative GRAPPA process to k-space data not corresponding to the movement of the object among the first set of motion corrupted k-space data.

2. The method as claimed in claim 1, wherein the first set of motion corrupted k-space data is at least one of undersampled k-space data and data acquired by parallel imaging.

3. The method as claimed in claim 1, wherein the first set of motion corrupted k-space data is auto-calibration signal (ACS) data.

4. The method as claimed in claim 1, wherein generating the image based on the second set of k-space data and the motion correction data comprises generating the image based on the motion correction data and data in the second set of k-space data that is not motion corrupted.

5. The method as claimed in claim 4, wherein the motion correction data is sensitivity information indicating a sensitivity of each of a plurality of coils which receive magnetic resonance signals from the object, and wherein generating the image based on the second set of k-space data and the motion correction data comprises generating the image based on the sensitivity information and the data in the second set of k-space data that is not motion corrupted.

6. The method as claimed in claim 4, wherein the motion correction data is a set of GRAPPA weights, and wherein generating the image based on the second set of k-space data and the motion correction data comprises generating the image based on the set of GRAPPA weights and data in the second set of k-space data that is not motion corrupted.

7. The method as claimed in claim 1, wherein the second set of k-space data is undersampled k-space data.

8. The method as claimed in claim 7, wherein the motion correction data is an ESPIRIT map, and wherein generating the image based on the second set of k-space data and the motion correction data comprises generating the image based on the ESPIRIT map and the second set of undersampled k-space data.

9. The method as claimed in claim 7, wherein the motion correction data is a set of GRAPPA weights, and wherein generating the image based on the second set of k-space data and the motion correction data comprises generating the image based on k-space data interpolated by the set of GRAPPA weights and the second set of undersampled k-space data.

10. The method as claimed in claim 7, wherein the motion correction data is sensitivity information indicating a sensitivity of each of a plurality of coils which receive magnetic resonance signals from the object, and wherein generating the image based on the second set of k-space data and the motion correction data comprises generating the image based on the sensitivity information and the second set of undersampled k-space data.

11. The method as claimed in claim 1, wherein the information indicating whether the object moved while scanning the object is detected by using navigator signals.

12. An apparatus for performing image processing, comprising:

processing circuitry configured to:

receive k-space data which is acquired by scanning an object by a magnetic resonance imaging apparatus, the k-space data including a first set of motion corrupted k-space data and a second set of k-space data, different from the first set of motion corrupted k-space data;

generate motion correction data based on the first set of motion corrupted k-space data and information indicating whether the object moved while scanning the object; and generate an image based on the second set of k-space data and the motion correction data, wherein the k-space data corresponding to a movement of the object among the first set of motion corrupted k-space data is not used for generating the motion correction data, and the motion correction data is generated based on motion-corrected k-space data generated by applying an iterative GRAPPA process to k-space data not corresponding to the movement of the object among the first set of motion corrupted k-space data.

13. The apparatus as claimed in claim 12, wherein the first set of motion corrupted k-space data is at least one of undersampled k-space data and data acquired by parallel imaging.

14. The apparatus as claimed in claim 12, wherein the first set of motion corrupted k-space data is auto-calibration signal (ACS) data.

15. A method of image processing comprising:

receiving k-space data which is acquired by scanning an object by a magnetic resonance imaging apparatus, the k-space data including a first set of motion corrupted k-space data and a second set of k-space data, different from the first set of motion corrupted k-space data;

generating motion correction data based on the first set of motion corrupted k-space data and information indicating whether the object moved while scanning the object; and generating an image based on the second set of k-space data and the motion correction data, wherein the k-space data corresponding to a movement of the object among the first set of motion corrupted k-space data is not used for generating the motion correction data, and the motion correction data is generated based on motion-corrected k-space data generated by applying at least one of an iterative GRAPPA process or an iterative RAKI process to k-space data not corresponding to the movement of the object among the first set of motion corrupted k-space data.

16. An apparatus for performing image processing, comprising:

processing circuitry configured to:

receive k-space data which is acquired by scanning an object by a magnetic resonance imaging apparatus, the k-space data including a first set of motion corrupted k-space data and a second set of k-space data, different from the first set of motion corrupted k-space data;

generate motion correction data based on the first set of motion corrupted k-space data and information indicating whether the object moved while scanning the object; and generate an image based on the second set of k-space data and the motion correction data, wherein the k-space data corresponding to a movement of the object among the first set of motion corrupted k-space data is not used for generating the motion correction data, and the motion correction data is generated based on motion-corrected k-space data generated by applying at least one of an iterative GRAPPA process or an iterative RAKI process to k-space data not corresponding to the movement of the object among the first set of motion corrupted k-space data.

* * * * *